US006839266B1

(12) United States Patent
Garrett, Jr. et al.

(10) Patent No.: US 6,839,266 B1
(45) Date of Patent: Jan. 4, 2005

(54) MEMORY MODULE WITH OFFSET DATA LINES AND BIT LINE SWIZZLE CONFIGURATION

(75) Inventors: Billy Wayne Garrett, Jr., Mountain View, CA (US); Frederick Abbott Ware, Los Altos Hills, CA (US); Craig E. Hampel, San Jose, CA (US); Richard M. Barth, Palo Alto, CA (US); Don Stark, Los Altos, CA (US); Abhijit Mukund Abhyankar, Sunnyvale, CA (US); Catherine Yuhjung Chen, Milpitas, CA (US); Thomas J. Sheffler, San Francisco, CA (US); Ely K. Tsern, Los Altos, CA (US); Steven Cameron Woo, Saratoga, CA (US)

(73) Assignee: Rambus Inc., Los Altos, CA (US)

( * ) Notice: Subject to any disclaimer, the term of this patent is extended or adjusted under 35 U.S.C. 154(b) by 311 days.

(21) Appl. No.: 10/101,243

(22) Filed: Mar. 20, 2002

Related U.S. Application Data

(62) Division of application No. 09/395,160, filed on Sep. 14, 1999, now Pat. No. 6,370,668.

(51) Int. Cl.[7] .............................................. G06F 13/40
(52) U.S. Cl. ............... 365/69; 365/185.11; 365/189.08; 365/231; 365/70; 711/5
(58) Field of Search ...................... 365/185.11, 185.12, 365/63, 67, 69, 70, 189.01, 189.08, 231; 710/38, 36, 26; 711/1, 5, 148; 714/763, 767

(56) References Cited

U.S. PATENT DOCUMENTS

| | | | | |
|---|---|---|---|---|
| 4,461,001 A | | 7/1984 | Bossen et al. | |
| 4,566,102 A | | 1/1986 | Hefner | |
| 4,584,681 A | * | 4/1986 | Singh et al. | .................... 714/7 |
| 4,604,751 A | | 8/1986 | Aichelmann, Jr. et al. | |
| 4,797,851 A | * | 1/1989 | Suzuki | ........................ 710/26 |
| 4,888,773 A | | 12/1989 | Arlington et al. | |
| 5,077,737 A | | 12/1991 | Leger et al. | |
| 5,109,497 A | * | 4/1992 | Bolstad et al. | .............. 711/200 |
| 5,233,690 A | * | 8/1993 | Sherlock et al. | ............. 345/531 |
| 5,269,001 A | * | 12/1993 | Guttag | ....................... 345/533 |
| 5,502,750 A | * | 3/1996 | Co et al. | ..................... 375/372 |
| 5,937,170 A | * | 8/1999 | Bedarida | ..................... 710/100 |
| 6,075,730 A | | 6/2000 | Barth et al. | |
| 6,128,696 A | | 10/2000 | Farmwald et al. | |
| 6,370,668 B1 | * | 4/2002 | Garrett et al. | .............. 714/763 |
| 6,493,843 B1 | * | 12/2002 | Raynham | ..................... 714/763 |
| 6,499,095 B1 | * | 12/2002 | Sexton et al. | ............... 711/203 |
| 6,691,276 B2 | * | 2/2004 | Holman | ...................... 714/767 |

OTHER PUBLICATIONS

Hennessy et al. Computer Organization and Design: The Hardware/Software Interface. 2nd ed. Morgan Kaufmann Publishers Inc., San Francisco, CA, 1998, p. 737.*

Chen et al., Yield analysis of reconfigurable array processors based on multiple-level redundancy, Computers, IEEE Transactions on, pp. 1136–1141 (Sep. 1993) vol. 42, Issue 9.

* cited by examiner

*Primary Examiner*—B. James Peikari
(74) *Attorney, Agent, or Firm*—Morgan, Lewis & Bockius LLP

(57) ABSTRACT

A memory module includes an array of N memory devices, each memory device having M data pins, where N is greater than M, and M and N are positive integers; and N bit lines traversing the array of N memory devices, such that each one of the N bit lines is connected to M of the N memory devices.

12 Claims, 24 Drawing Sheets

| CYCLE | ROW[2] | ROW[1] | ROW[0] |
|---|---|---|---|
| 0 | BIT 1<br>BIT 4 | BIT 2<br>BIT 5 | BIT 3 |
| 1 | | | |
| 2 | | | AV |
| 3 | | | |

ROW PACKET STRUCTURE

FIG.5A

| CYCLE | COL [4] | COL [3] | COL [2] | COL [1] | COL [0] |
|---|---|---|---|---|---|
| 0 | BIT 1 | BIT 2 | BIT 3 | BIT 4 | BIT 5 |
| 1 | | | COPBIT 1 | COPBIT 2 | |
| 2 | | | | | |
| 3 | | | | | |

COLUMN PACKET STRUCTURE

FIG.5B

NON-CHIP-KILL DATA PACKET
CYCLE (TIME) MULTIPLEXING

NON-CHIP-KILL DATA PACKET
BIT MULTIPLEXING

MEMORY DEVICE ID BITS

| DI[2] | 0 | 0 | 0 | 0 | 1 | 1 | 1 | 1 |
|---|---|---|---|---|---|---|---|---|
| DI[1] | 0 | 0 | 1 | 1 | 0 | 0 | 1 | 1 |
| DI[0] | 0 | 1 | 0 | 1 | 0 | 1 | 0 | 1 |

HALF-CYCLE TO TRANSMIT/RECEIVE ON

| 0 | 1 | 2 | 3 | 4 | 5 | 6 | 7 |
|---|---|---|---|---|---|---|---|
| 1 | 2 | 3 | 4 | 5 | 6 | 7 | 0 |
| 2 | 3 | 4 | 5 | 6 | 7 | 0 | 1 |
| 3 | 4 | 5 | 6 | 7 | 0 | 1 | 2 |
| 4 | 5 | 6 | 7 | 0 | 1 | 2 | 3 |
| 5 | 6 | 7 | 0 | 1 | 2 | 3 | 4 |
| 6 | 7 | 0 | 1 | 2 | 3 | 4 | 5 |
| 7 | 0 | 1 | 2 | 3 | 4 | 5 | 6 |

MAPPING OF DEVICE ID TO TRANSMISSION HALF-CYCLE

DEVICE I BITS FROM THE DEVICE IDF, OF THE COL PACKET

| DC[2] | DC[1] | DC[0] |
|---|---|---|
| 0 | 0 | 0 |
| 0 | 0 | 1 |
| 0 | 1 | 0 |
| 0 | 1 | 1 |
| 1 | 0 | 0 |
| 1 | 0 | 1 |
| 1 | 1 | 0 |
| 1 | 1 | 1 |

FIG.10

EXCLUSIVE NOR MASKING FUNCTION TABLE

|  | | DI[2] · · · DI[0] | | | | | | | |
|---|---|---|---|---|---|---|---|---|---|
| | | 0 | 1 | 2 | 3 | 4 | 5 | 6 | 7 |
| DC[2] · · · DC[0] | 0 | 7 | 6 | 5 | 4 | 3 | 2 | 1 | 0 |
| | 1 | 6 | 5 | 4 | 3 | 2 | 1 | 0 | 7 |
| | 2 | 5 | 4 | 3 | 2 | 1 | 0 | 7 | 6 |
| | 3 | 4 | 3 | 2 | 1 | 0 | 7 | 6 | 5 |
| | 4 | 3 | 2 | 1 | 0 | 7 | 6 | 5 | 4 |
| | 5 | 2 | 1 | 0 | 7 | 6 | 5 | 4 | 3 |
| | 6 | 1 | 0 | 7 | 6 | 5 | 4 | 3 | 2 |
| | 7 | 0 | 7 | 6 | 5 | 4 | 3 | 2 | 1 |

FIG.12

MEMORY MODULE WITH OFFSET DATA LINES AND BIT LINE SWIZZLE CONFIGURATION

CROSS REFERENCE TO RELATED APPLICATION

This is a division of application Ser. No. 09/395,160 filed Sep. 14, 1999, now U.S. Pat. No. 6,370,668.

FIELD OF THE INVENTION

A memory system characterized by high speed data throughput on a bus between a memory controller and an associated plurality of memory devices is disclosed, wherein the memory system is capable of selectively operating in non-chip-kill and chip-kill modes. A method of selectively operating the memory system is either non-chip-kill or chip-kill modes is also disclosed.

BACKGROUND OF THE INVENTION

During the last several decades, memory technology has progressed dramatically. The density of commercial memory devices, taking Dynamic Random Access Memory (DRAM) as a convenient example, has increased from 1 Kbit to 64 Mbits per chip, a factor of 64,000. Unfortunately, memory device performance has not kept pace with increasing memory device densities. In fact, memory device access times during the same time period has only improved by a factor of 5. By comparison, during the past twenty years, microprocessor performance has increased by several orders of magnitude. This growing disparity between the speed of microprocessors and that of memory devices has forced memory system designers to create a variety of complicated and expensive hierarchical memory techniques, such as Static Random Access Memory (SRAM) caches and parallel DRAM arrays. Further, now that computer system users increasingly demand high performance graphics and other memory hungry applications, memory systems often rely on expensive frame buffers to provide the necessary data bandwidth. Increasing memory device densities satisfy the overall quantitative demand for data with fewer chips, but the problem of effectively accessing data at peak microprocessor speeds remains.

Overlaying the problem of data access speed, some computer systems have particularly high requirements for availability and reliability. Central data processing systems at banks and financial institutions, Internet service providers, and telecommunications control systems are ready examples of computer systems which simply can not fail when accessed by a user. The inevitable occurrence of memory device failures within such computer systems has lead to the development of numerous methods and features whereby memory device failures are detected and corrected without shutting down the computer system. One such method is called "chipkill."

Conventional chip-kill will be explained with reference to FIG. 1. FIG. 1 illustrates a conventional memory system with the architectural changes required to implement chip-kill. In FIG. 1, four memory devices 10 are arranged along a data bus 12. In the example, each memory device is a Dual In-Line Memory Module (DIMM) including 18 DRAMs, each DRAM communicating 4 data bits to/from data bus 12 (i.e., 18×4 DRAMs). For clarity, only the data line connections for a single DRAM are shown. This example assumes four (4) groups of 72 bits each (of which 64 bits are data to be returned to the requestor and 8 bits are used for error correction) are communicated by the memory system, thus transferring 256 bits of data, to a requester, normally a controller or microprocessor connected to the memory system. Notably, in the conventional chip-kill memory system two quantities of data are returned by each memory device during a read operation: (i) 16 bytes of data to be returned to the requester, and (ii) an 2 additional bytes of data used for error detection and correction. These additional 2 bytes of data are called "syndrome."

Syndrome is used in error detection and correction algorithms to determine whether data from a given memory device contains one or more errors. Some algorithms merely detect the presence of data error(s). Other algorithms have the ability to actually correct one or more detected errors. Single-error-correct/double-error-detect (SECDED) algorithms are well understood by those of ordinary skill in the art. Many other conventional error detection and correction algorithms are known, but as a rule the requirement for additional bits of syndrome increases with the increasing sophistication of the algorithm, i.e., the ability of an algorithm to detect and correct data errors depends on the quantity of associated syndrome provided. For one type of SECDED algorithm, the relationship between data and associated syndrome is well known: the number of syndrome bits increases as the log of the number of data bits. So, 64 bits of data require 8 bits of syndrome, 128 bits of data require 9 bits of syndrome, 256 bits of data require 10 bits of syndrome, etc.

Returning to FIG. 1, each of the four memory device returns 18 bits of data. Thus, 288 bits (256 bits of data and 32 bits of syndrome) are actually read during a read operation. In the example, 8 bits of syndrome are applied to each one of four error correcting code (ECC) generators 14 along with 64 bits of data. Using a known SECDED algorithm, this is enough syndrome to detect up to two bit errors in the 64 bits of data, and correct one bit error.

By having each DRAM in the example supply one bit of data to each ECC generator, the failure of one DRAM can be tolerated since each ECC generator will detect and be able to correct the resulting bit error. Once error detection and correction is complete each ECC generator 14 strips syndrome from the data and communicates the data to the requestor. During a write operation, the opposite flow of data occurs. A 256 bit block of data is presented by the requestor to the memory system and divided between ECC generators 14 into separate 64 bit blocks of data. Each ECC generator computes the required syndrome bit values and adds syndrome data to the 64 bits of data. The resulting 72 bits data block is then stored in memory devices 10.

Error detection and correction by the ECC generators 14 is typically monitored within the computer system. Should any one DRAM fail, the system may "replace" the failed DRAM with a spare (not shown). This replacement process may be performed in background processing while the computer system remains available to users. In the unlikely event of simultaneous failures in two DRAMs, the computer system in the foregoing example could detect the two failures, but remedial action would require maintenance intervention. Such a happenstance would force a system shut-down or switch over to a back-up system. A more powerful error correction algorithm, one capable of correcting two bit errors, would avoid this event.

In sum, conventional memory systems implementing chip-kill read and write both data and syndrome to an ECC generator(s) during each operation. Further, the amount of syndrome furnished by each DRAM to individual ECC generators is dependent on the type of error detection and correction algorithm being used by the computer system. More powerful error detection and correction algorithms require more syndrome bits.

As can be seen from the foregoing example, conventional memory systems use a large number of data lines, or a relatively wide bus. The term "line(s)" is used to describe the physical mechanism by which data bits are electronically communicated from one point to another in a system. A line may take the form, alone or in combination, of a printed circuit board (PCB) strip, metal contact, pin and/or via, microstrip, semiconductor channel, etc. A line may be single or may be associated with a bus. A "bus" is a collection, fixed or variable, of lines, and may also be used to describe the drivers, laches, buffers, and other elements associated with an operative collection of lines. A bus may communicate control information, address information, and/or data. In the foregoing example, four sets of 72 data bit lines connect the memory devices 10 and ECC generators 14. On the other side of the ECC generators, four sets of 64 data bit lines combine to form a 256 bit wide data bus.

Such massively parallel, or wide buses, are required in conventional memory systems due to the slow access speed of memory devices. Wide buses have long been associated with implementation and performance problems, such as excessive power consumption, slow speed, loss of expandability and design flexibility, etc. Thus, various attempts have been made to effectively use relatively narrower buses. In one common approach, packets of data larger than the width of the bus are divided into portions, and the resulting portions are then transmitted over a number of cycles.

Transmission of data over a number of cycles does allow reduction of the bus size. It also greatly increases system complexity. Such complexity often results in memory system rigidity. That is, once implemented in all its complexity, the integration of a new function into the memory system becomes extremely difficult. In particular, memory system designers continue to face enormous challenges in increasing data throughput while minimizing system complexity, and maintaining system reliability.

SUMMARY OF THE INVENTION

The present invention provides a memory system capable of operating in non-chip kill and chip-kill modes. In so doing, the present invention retains the advantages of packetized command and data structures, a simplified bus architecture, high effective data bandwidth, a standard interface, and lower power consumption.

As compared with conventional memory systems, the present invention is able to provide more syndrome bits per data block, thus allowing a broader range of error detection and correction schemes.

The chip-kill mode and/or the non-chip kill mode of operation may be designed and implemented to utilize, for example, cycle multiplexing, bit line multiplexing, or a combination of cycle and bit line multiplexing (i.e., time/space multiplexing).

In one aspect of the present invention, a single memory device responds to a given command, set of commands, instruction, or part of an instruction while the memory system is operating in non-chip-kill mode. However, the same command, set of commands, instruction, or part of an instruction causes a plurality of memory devices to respond while the memory system is operating in chip-kill mode.

In another aspect of the present invention, the packet nature of commands from a memory controller, for example, to a plurality of memory devices is adapted to communicate a command of similar format in either chip-kill or non-chip-kill modes, yet such a similarly formatted command causes one memory device to respond in non-chip-kill mode, while causing a plurality of memory devices to respond in chip-kill mode. This may be done for both read commands and write commands.

BRIEF DESCRIPTION OF THE DRAWINGS

Several embodiments of the present invention are discussed below with reference to the drawings, in which:

FIGS. 5A and 5B illustrate exemplary ROW and COL packet command formats, respectively;

FIG. 10 shows a tabular combination of Col packet device ID and memory device ID inputs addressing a transmission cycle control map;

FIG. 12 shows a logic table for an exemplary exclusive NORing function for the logic comprising the chip-kill decoder of FIG. 11;

DETAILED DESCRIPTION

The assignee of the present invention has pioneered the development of next generation memory systems having a relatively narrow, high speed bus(es) and associated memory devices, along with the interface technology required to provide high data throughput. See, U.S. Pat. Nos. 5,319,755; 5,243,703; and 5,254,883, the disclosures of which are incorporated herein by reference.

Figure 1:
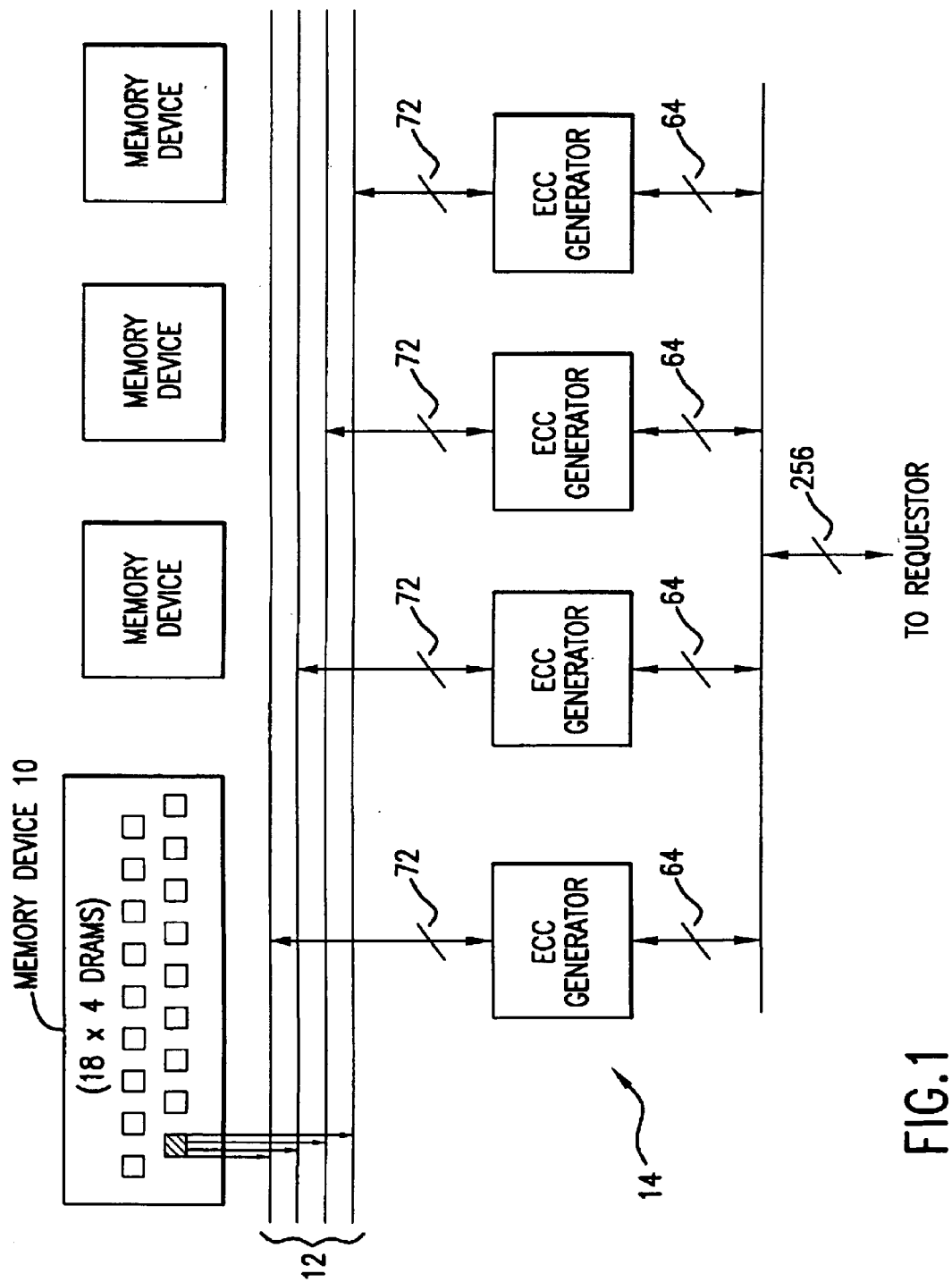
FIG. 1 schematically illustrates a conventional memory system implementing chip-kill.
Figure 2:
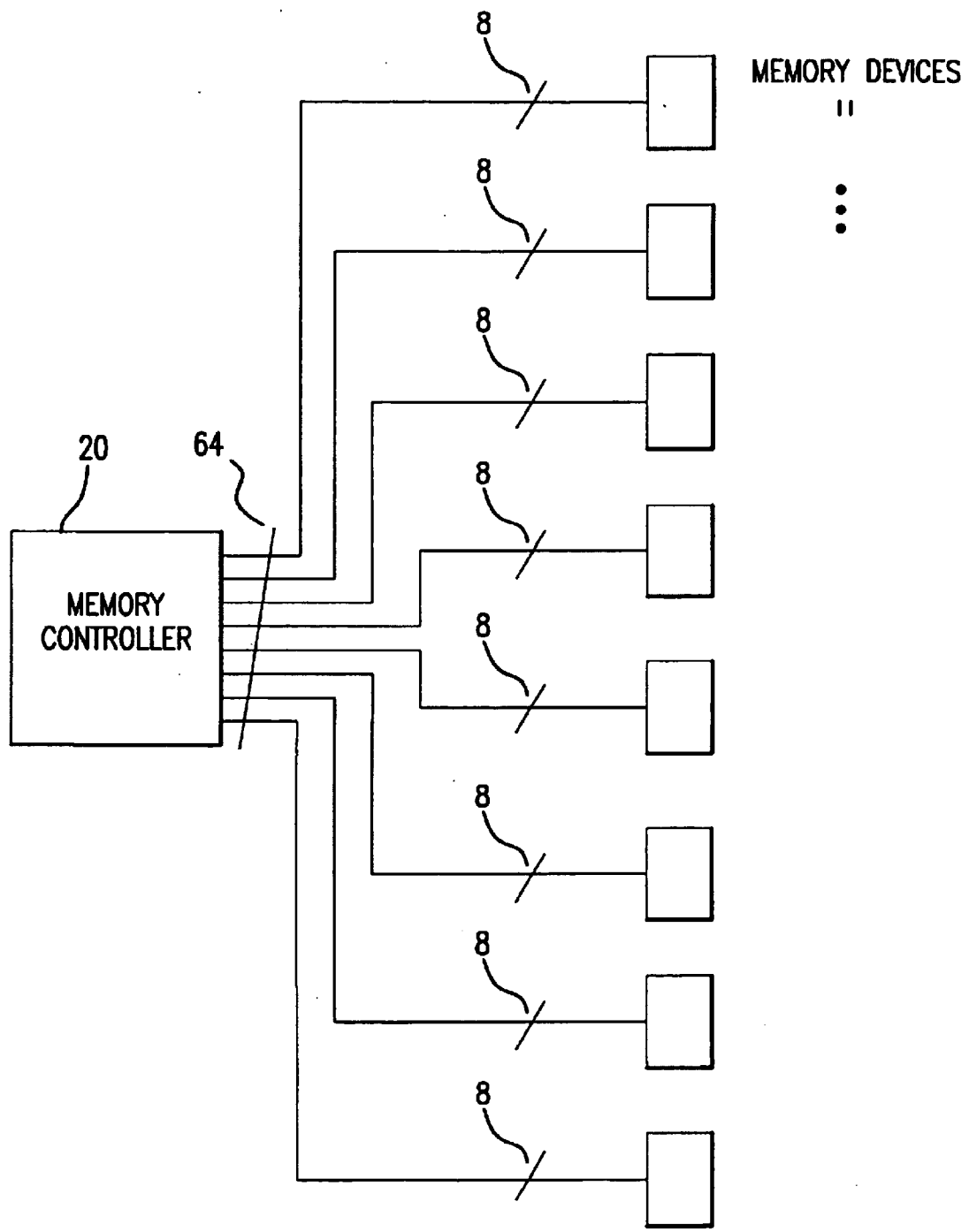
FIG. 2 schematically illustrates a conventional "wide-bus" memory system.
Figure 3:
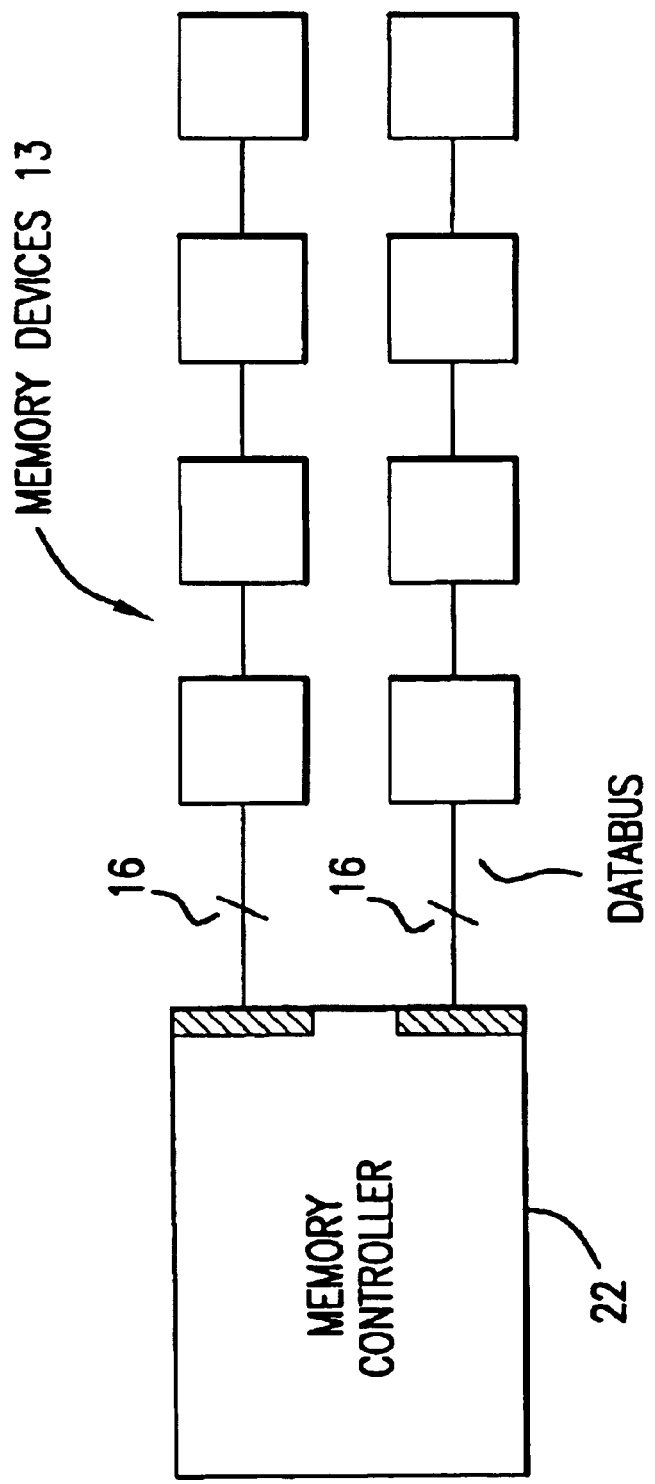
FIG. 3 schematically illustrates an improved memory system comprising a relatively narrow bus.

Very general differences between conventional memory systems and the assignee's memory systems can be seen by comparing FIGS. 2 and 3. In FIG. 2, eight 8-bit memory devices 11 are connected to a memory controller 20 by a 64-bit bus. Assuming 8-bit bytes and a system clock running at 100 MHz, the total data throughput for the conventional system is 800 MB/sec.

In FIG. 3, eight 8-bit memory devices according to the assignees design 13 are connected to a memory controller 22 by two 16 bit data buses. Since each of the assignee's memory devices is capable within the memory system architecture of communicating data on both edges of a 400 MHz clock, for an effective transfer rate of 800 MHz, across a two byte wide channel, the example has a total data throughput of 3.2 GB/sec.

In effect, the assignee's solution replaces costly, conventional memory subsystems and interconnections with a single, standard chip-to-chip bus and improved memory devices. The term "memory device" as used in this document broadly describes a range of devices capable of storing data, and receiving and/or transmitting data at the request of controlling device(s). All forms and configurations of DRAMs, SRAMs, ROM, EPROM, and $E^2$PROM devices are contemplated by the term memory device. One defining feature of the term memory device is the presence of electronically accessible data stored in the row and column structure typical in the foregoing devices. Rows within this structure may be further designated into banks and/or pages.

In addition to the referenced U.S. Patents, information describing the assignee's memory systems and memory devices may be had at Rambus™ Inc., Mountain View, Calif. See, for example, the Direct RDRAM™ 64/72-Mbit Data Sheet, the Direct RAC Data Sheet, the Direct RMC.d1 Data Sheet, A Logical View of the Direct Rambus Architecture, Direct Rambus Technology Overview, Direct Rambus Clock Generator Source Sheet, Direct Rambus RIMM™ Module Data Sheet, the Direct Rambus Memory Controller Summary, all 1998 documents and all incorporated herein by reference.

Figure 4:
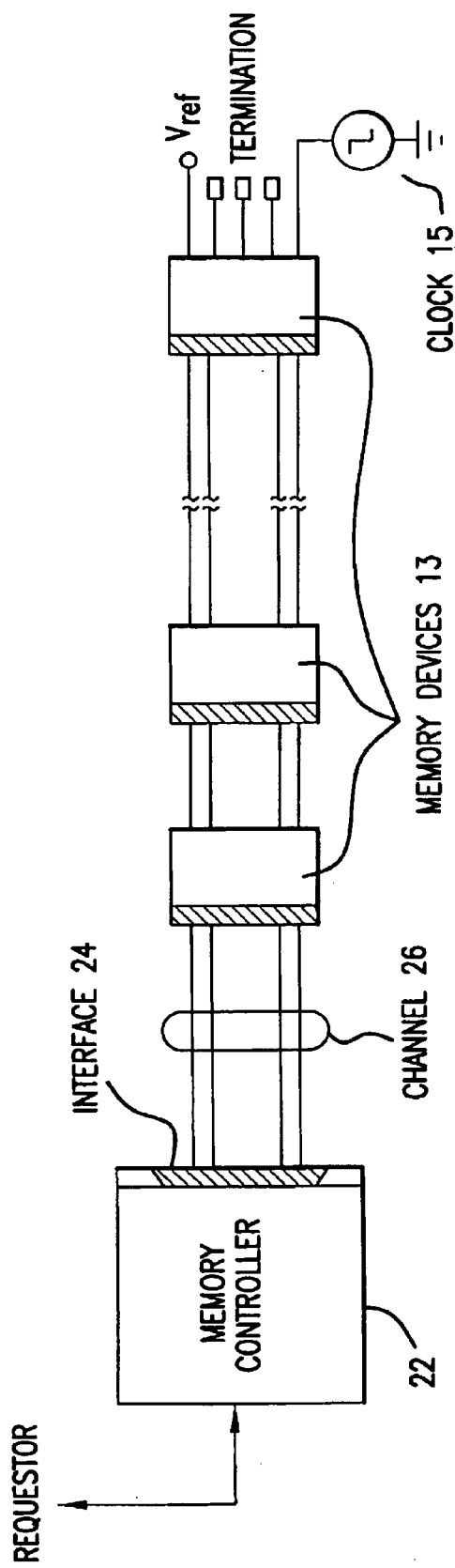
FIG. 4 schematically illustrates the improved memory system of FIG. 3 in some additional detail.

A memory system according to the present invention is generally shown in FIG. 4, wherein a memory controller 22 is connected to a plurality of memory devices 13 via a channel 26. Memory controller 22 and memory devices 13 typically include an interface 24 to channel 26. The memory devices are preferably 16 bit or 18 bit (2 byte) devices, but one of ordinary skill in the art will appreciate that the memory devices might be configured with any convenient number of bits and with any definition of byte size. Memory devices 13 only respond to memory controller 22, and accordingly require a relatively low level of intelligence. As a result, memory device die size overhead is minimized to keep the memory devices affordable.

Memory controller 22 is the only device generating commands to memory devices 13. Data transfers occur only between memory controller 22 and memory devices 13, never between memory devices.

Memory controller 22 interfaces with a "requester," external to the memory system. Generically, the requestor is any device requesting data be read/written from/to the memory system or performing memory device upkeep such as refresh, and may include, alone or in any combination, a conventional microprocessor, peripheral device, ASIC, conventional memory controller, or graphics chip. Memory controller 22 receives a command from the requester and translates the address, data, and control components of the command into a protocol common to memory controller 22 and memory devices 13.

Channel 26 connotes a system level specification defining a number of buses and signal lines, as well as their electrical and mechanical interfaces, including signaling levels and signal timing. A number of signal types may be present on channel 26 at any given time. In addition to a data bus, an address/control bus, and reference voltage lines, channel 26 may include various clock signals.

Preferably, bus lines in channel 26 are terminated at their characteristic impedance at one end. Thus, the bus topology of channel 26 finds memory controller 22 at one end and terminators at the other end, with memory devices in between. The terminators pull bus line signals up to the system supply voltage $V_{term}$ which corresponds to logic "0" in the memory system. A memory device or memory controller 22 assert a logic "1" by sinking current from a line, preferably using an open-drain NMOS transistor structure. Thus, power is principally dissipated on channel 26 only when a device drives a logic 1 on a line.

Channel 26 is synchronous, meaning that all command and data transfers are referenced to clock edges. Preferably, a memory device sends data to memory controller 22 synchronous with one clock signal, and memory controller 22 sends data to memory devices 13 synchronous with another clock signal. Because the lines in channel 26 are matched, the clock and data signals remain synchronized as they are transferred between devices. Data transfers may occur on both edges of the memory system clock.

On channel 26, data, control information, and address information move in packets. Each packet is transferred via channel 26 during a defined period of time. In one presently preferred embodiment, the period of time is four clock cycles, but any number of clock cycles might be conveniently used. Control/address information may be multiplexed with data on a single bus structure, however as presently preferred, an independent control/address bus is used, and data is transferred via a separate data bus.

There are at least two types of command packets: ROW and COL. These command packets have a predetermined structure or format, and include a number of bit fields. Some of these bit fields have fixed definitions, while the definition of others changes depending on the value(s) of other bit fields.

Generally specking, ROW packets communicate an instruction from the memory controller 22 to memory devices 13 related to memory device row operations. See, FIG. 2. Assuming as an example that memory devices 13 are DRAMs, the ROW packet command is used to activate a memory device, or to precharge rows in a memory device. The activate command acts like the falling edge of RAS in a conventional DRAM, and the precharge command acts like the rising edge of RAS. An activate command can be sent to any DRAM bank whose sense-amplifiers have been precharged. Other ROW packet commands include, for example, refresh, power state control, etc. Preferably, a ROW packet contains up to 24 bits of control information sent during a time period of four clock cycle over three lines of the control/address bus.

In part, an exemplary ROW packet structure is illustrated in FIG. 5A. In non-chip-kill mode, the ROW Packet addresses a memory device using a (first) device identification (ID) field. The ROW packet device ID field comprises a number of bits, for example bits 1–5 in FIG. 5A, communicated on the rising and failing edges of a first clock cycle, cycle 0, over three lines of the control/address bus, designated as ROW[3] through ROW [0]. The device ID field may include an additional bit used in certain "broadcast" functions in which all memory devices respond to a ROW packet. However, for the sake of simplicity the exemplary ROW packet device ID field discussed hereafter is assumed to have 5 bits.

These bits, ranging from most significant bit 1 to least significant bit 5, in combination with an activation bit, form a device activation code that identifies one or more memory devices. In effect, the device activation code is interpreted in a memory device ID register to select a corresponding memory device. That is, in non-chip-kill mode, each bit in the ROW packet device ID field must properly match a corresponding value in a specific memory device ID register in order to activate the memory device. In the activate command, the bank and row of the "activated memory device" specified in the packet command transitions from precharged to in active, thus becoming ready for a subsequent operation identified by a COL packet.

Column (COL) packets are also sent across the control/address bus. COL packets carry column instructions, like read and write instructions from the memory controller to a memory device. In part, an exemplary COL packet structure is illustrated in FIG. 5B. Preferably, the COL packet contains up to 40 bits of control information sent during a time period of four clock cycle over five lines of the control/address bus. The preferred COL packet is split into at least two fields. The first field specifies the primary operation, such as a Read or Write, to be performed by an activated memory device(s). This first field is shown, as an example, by bits COP bit 1 and COP bit 2 in FIG. 5B. The second field (not shown in FIG. 5B) can be used for masks, such as for Writes, or can be an extended operation (XOP) command, like an explicit Precharge.

The COL packet also includes a (second) device ID field, including a number of bits ranging from a most significant bit 1 to a least significant bit 5. These bits form the device ID code, shown for example in FIG. 5B as bits 1–5, communicated on the rising edge of the first clock cycle, cycle 0, over five lines of the control/address bus, designated as COL[4] through COL[0]. The memory controller performs the operation specified by COP bit 1 and COP bit 2 on the memory devices identified by the COL packet device ID field.

In non-chip-kill mode, a data packet is sent from the memory controller to a memory device during a Write operation. In a Read operation, a data packet is returned to the memory controller from a memory device. The term "returned" is used in reference to the fact that all Read operations begin with a Read command issued from the memory controller, and to avoid potential confusion by use of a generic term such as "transmit" or "sent" which might also apply to a Write data packet from the memory controller.

Preferably, the data packet contains 16 bytes of data, returned to the memory controller during a Read operation over dual 8-bit data buses, DQA and DQB during four clock cycles. See FIG. 6. One byte of data per data bus is read on each rising and falling edge of the clock. During a Write operation, data packets may be masked to allow as little as a single byte to be written.

Chip-kill mode may be indicated in a memory system according to the present invention in a number of ways. For example, a single "chip-kill enable" bit in an initialization register may be set during manufacture of the memory system. Alternatively, the chip-kill enable bit might be set by a requester upon system initialization. However set, the chip-kill enable bit defines for the memory system whether it operates in non-chip-kill mode or in chip-kill mode.

As noted above with respect to conventional memory systems, in chip-kill systems data to be read from and written to the memory system is spread across multiple memory devices so that an ECC generator can be used together with an error detection and correction algorithm to detect and correct data errors. In the present invention, this general concept is followed. That is, data is read from and written to a plurality of memory devices through an ECC generator resident in the memory controller.

Returning to the exemplary structure in FIG. 3, an ECC generator of conventional design may be readily incorporated into memory controller 22. The actual specification and integration of an ECC generator into memory controller 22 is a matter of design choice and exercise of ordinary skill in the art. Since the structure and function of the ECC generator will vary with the nature of the error detection and correction algorithm in use, and with the overall memory system definition, no attempt is made to illustrate a particular ECC generator. Rather, as with the conventional system, the ECC generator in the present invention will generate the necessary syndrome and add the syndrome to data packets being written into memory, and will separate and utilize syndrome stored in memory to detect and correct errors in the data being read from memory.

Data packets may be "spread over" a number of memory devices in the present invention using any one of several methods. Cycle multiplexing, bit multiplexing, or both may be used to time multiplex, space multiplex, time and space multiplex the data across a number of memory devices.

Figure 6:
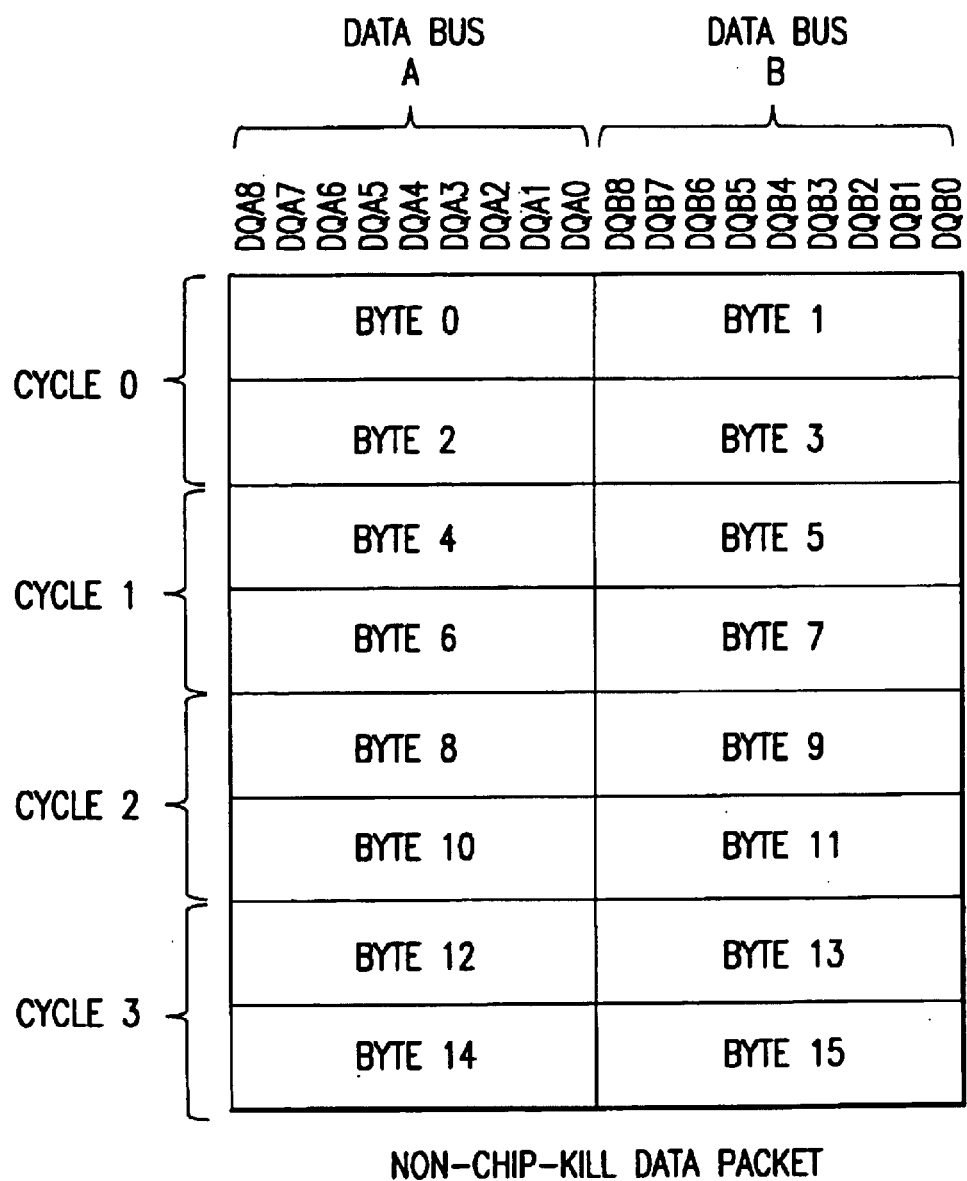
FIG. 6 illustrates an exemplary data packet returned in non-chip-kill mode.
Figure 7:
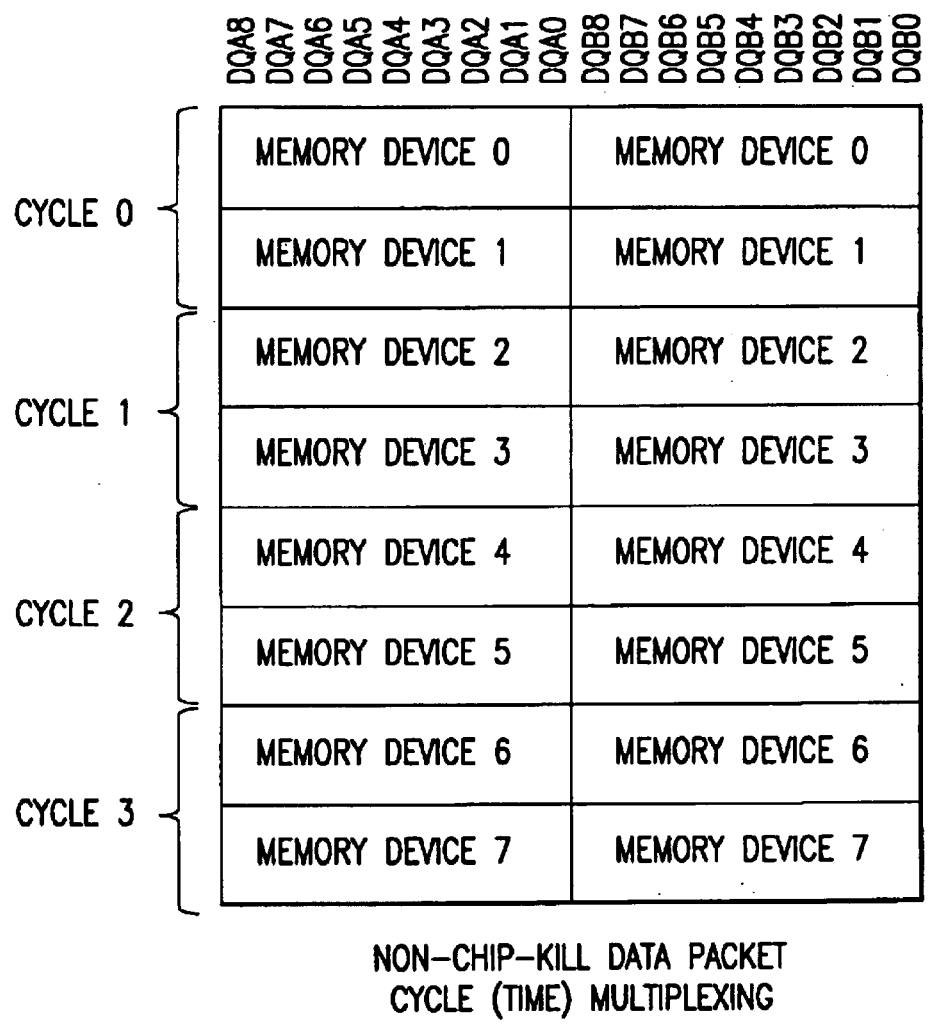
FIG. 7 illustrates an exemplary data packet returned in chip-kill mode using cycle (or time) multiplexing.

Cycle multiplexing of a data packet in the present invention is illustrated in FIG. 7, and by a comparison of FIG. 7 to the data packet shown in FIG. 6. Again, a 16 byte, 9-bit per byte, data packet read from memory via two 9-bit data buses, DQA and DQB, over four clock cycles is assumed as an example. However, when the memory system according to the present invention is operated in chip-kill mode, rather than activating one memory device and reading 16 data bytes (a first data block) from the activated memory device during the four clock cycles (a first time period) as it does in non-chip-kill mode, a plurality of memory devices are activated, as described below, and 2 data bytes (a second data block) are read in sequence from each one of eight memory devices during each half clock cycle (a second time period), i.e., on either a rising or a falling clock edge.

Thus, in the example illustrated in FIG. 7, and assuming a read operation, memory device 0 returns two 9-bit bytes of data on the rising edge of clock cycle 0. One byte of data is returned via data bus DQA and the other byte of data is returned on data bus DQB. In sequence, memory device 1 follows on the falling edge of clock cycle 0, and so on, down to memory device 7 which returns two bytes of data on the falling edge of clock cycle 3. One of ordinary skill in the art will readily understand from this description that sixteen memory devices might be used to provide one byte of data on either DQA or DQB per half clock cycle. Similarly, a single 16-bit data bus might receive 16-bit data quantities from eight memory devices. Such division and definition of data packets and data buses, along with packet transfer timing and clock cycle definition is a matter of design preference, and will take into account the capabilities and specifications of the memory devices used in the memory system. The aforementioned implementations also work for 8-bit bytes.

When the memory system is operating in chip-kill mode, syndrome for a first data block can be distributed among the second data blocks read from each one of the plurality of memory devices. The exact form of such syndrome distribution is left to the memory system designer. Syndrome may be evenly spread across a group of second data blocks, or some second data blocks may be entirely made up of syndrome. During the four clock cycle period of time, a complete 16-byte data packet is returned to the memory controller. That is, the 16 bytes forming the data packet are returned two bytes per half clock cycle from each of eight memory device during this time period. The data packet returned to the memory controller in chip-kill mode has the same number of bytes as the data packet returned in non-chip-kill mode. Further, the data packet returned in chip-kill mode is transmitted over the same structure and using the same data packet transfer timing as those used in non-chip-kill mode. The additional timing mechanism required to sequentially read a series of second data blocks from the plurality of memory devices in order to form the first data block is discussed below with reference to the ROW and COL command packets used in chip-kill mode.

During a Write operation, the transfer of data is essentially reversed. A data packet received from the requester is evaluated by the ECC generator resident in the memory controller. Syndrome is generated and added to the data and stored in a plurality of memory devices during the same time period required to write a data packet in non-chip-kill mode.

In fact, cycle multiplexing in chip-kill mode is similar to the method used to mask write operations in non-chip-kill mode. In non-chip-kill mode, write masking is used to selectively write bytes of data into a memory device. Thus, the write masking hardware available in the memory system may be used for non-chip-kill and chip-kill operations. However, use of the common write mask hardware in chip-kill mode may well preclude the use of conventional Write Masks in chip-kill mode. Alternatively, additional masking hardware can be incorporated into the memory system and enabled only during chip-kill operation.

Figure 8:
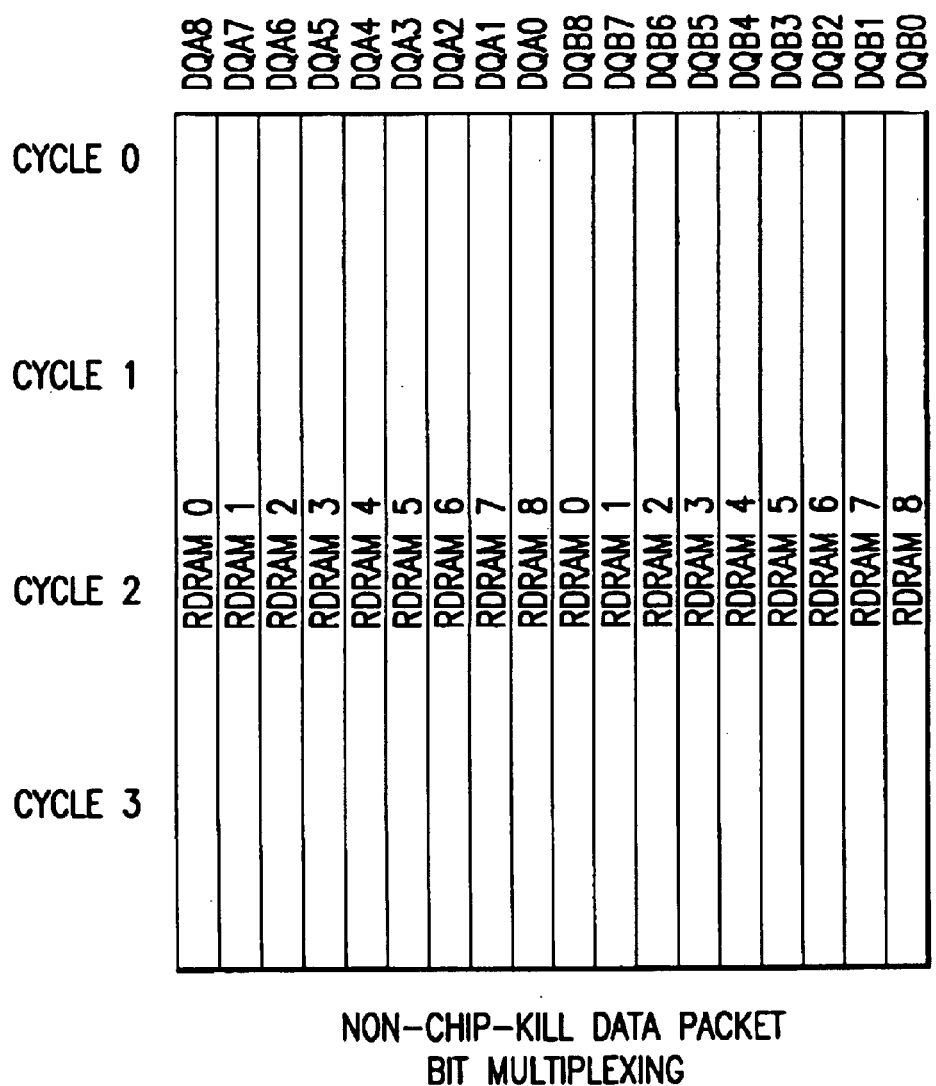
FIG. 8 illustrates an exemplary data packet returned in chip-kill mode using bit (or bit line space) multiplexing.

The basic concept of bit multiplexing of a data packet in the present invention is illustrated in FIG. 8, and by a comparison of FIG. 8 to the data packets shown in FIGS. 6 and 7. Alternatives to the approach illustrated in FIG. 8 will be discussed below with reference to FIGS. 20, 21, and 22. Again, a 16 byte, 9-bit per byte, data packet read from memory via dual 8-bit data buses, DQA and DQB, over four clock cycles is assumed as an example. However, unlike the previous method in which clocks cycles were multiplexed between a plurality of memory devices to transfer a data packet, the present method multiplexes data bus lines between the plurality of memory devices. In the example shown in FIG. 8, each one of the plurality of memory devices responding to the chip-kill read command "seizes" one or more line(s) on data bus DQA and data bus DQB. Each memory device then transfers one bit of data per seized data bus line during each half clock cycle of the four clock cycle period during which a data packet is returned to the memory controller in a Read operation. Again, this method is equally applicable to 8-bit bytes.

In effect, one or more data bus lines remain "dedicated" to a memory device during the data packet transfer period (the first time period). When data transfer is complete, the dedicated data bus lines are released to some other function. The present invention contemplates interruption of this unitary data transfer period according to various well understood priority interrupt schemes which may seize the data bus during a data transfer period. Such an occurrence does not change the fact that for the entire data transfer period one or more data lines are dedicated to each activated memory device in order to return a portion (second data block) of the complete data packet (first data block) during the data transfer period.

Figure 9:
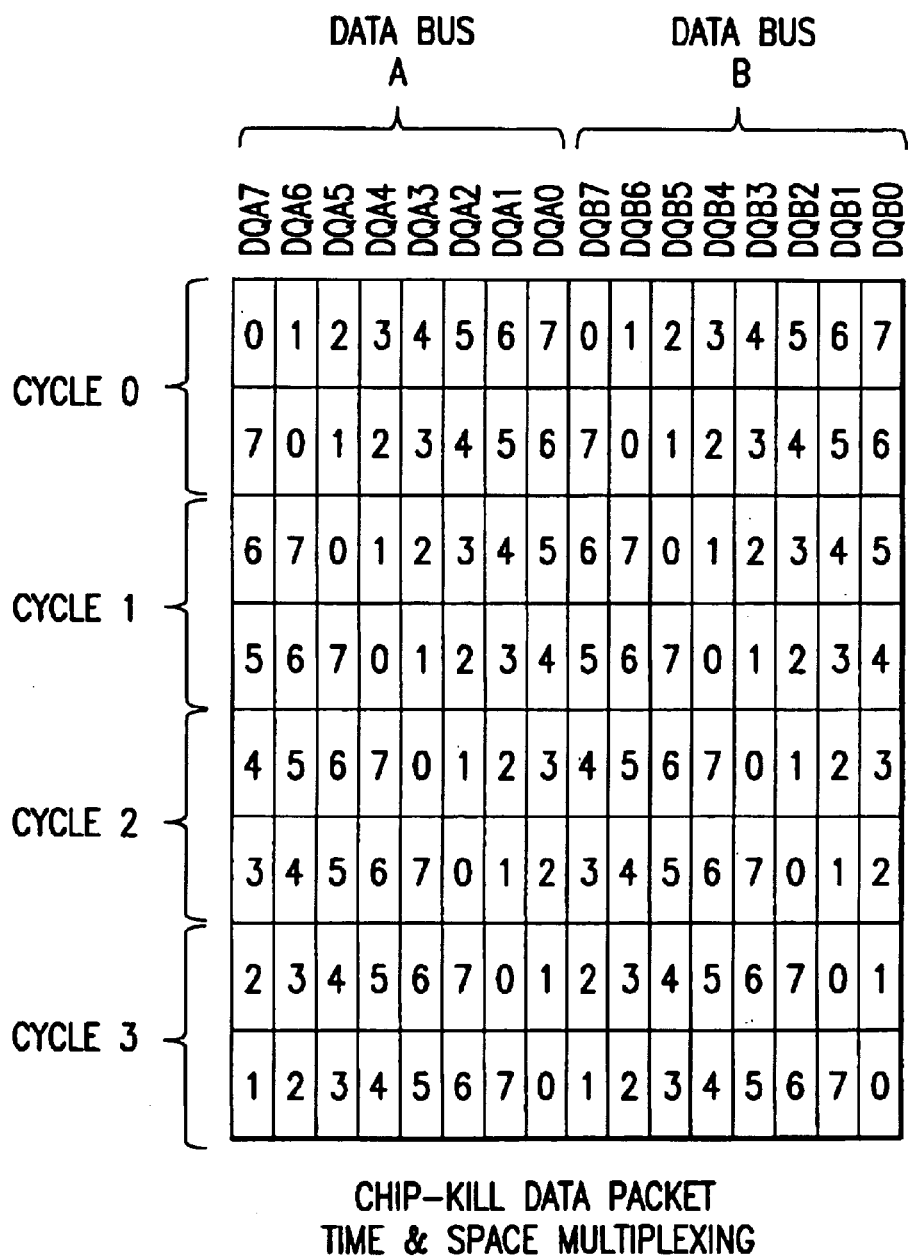
FIG. 9 illustrates an exemplary data packet returned in chip-kill mode using time and space multiplexing.

A combination of the cycle multiplexing and bit multiplexing results in time and space multiplexing of a data packet, as illustrated in FIG. 9. A 16 byte, 8-bit/byte, data packet read from memory via dual 8-bit data buses, DQA and DQB, over four clock cycles is assumed as an example. The time and space multiplexing method provides another type of memory system protection. When bit multiplexing is used, if a single output driver on one of the memory devices fails, then each half clock cycle of data may contain an error. However, by rotating bus lines between the plurality of memory devices every half clock cycle, a single output driver failure will introduce, at most, one bit error per half clock cycle. However, as opposed to the method of multiplexing bus lines, in this method an output driver error causes the data on one bus line to be incorrect, but the error is spread among data from different devices.

As illustrated in the FIG. 9, each one of the plurality of memory devices responding to a chip-kill read command seizes a selected line on each one of data bus DQA and DQB and returns a data bit (second data block) to the memory controller via the selected line during each half clock cycle. However, unlike the bit multiplexing method in which a memory device retains use of a bus line during the entire data transfer period required for transfer of a data packet to the memory controller, the time and space multiplexing method may "select" a different data bus line for each memory devices during each half clock cycle. Thus, in effect, FIG. 9 is one exemplary "Bit Multiplexing Table" indicating which bus line a memory device drives as a function of time, here a half clock cycle. A preferred method by which each memory device selects a bit line per half clock cycle is discussed below.

In a memory system according to the present invention, multiple memory devices may respond to certain command packets. This is true for non-chip-kill mode as well as chip-kill mode. In fact, some commands, like refresh operations can generate responses in a group of memory devices or in one memory device. However, each one of the memory devices is given a unique device identification (ID) during initialization. Part of this unique device ID may be used to determine which bit line per half clock cycle each memory device reads/writes as part of a data packet transfer during chip-kill operation.

The structure, or format, of ROW and COL packets has been described above in relation to non-chip-kill mode. This format need not change in chip-kill mode. However, certain bits in the command packets are redefined in chip-kill mode. In other words, command packet bits in some bit fields are interpreted differently by memory devices in chip-kill mode.

In the following description of chip-kill ROW and COL packets, it is assumed that eight memory devices respond as a group to the ROW and COL packets, and that each memory device read/writes two 9-bit bytes of data to form a sixteen byte data packet in a memory system using cycle multiplexing over four clock cycles. This is, however, only an example.

The description of chip-kill ROW packets can be divided into two parts: activation packets (AV=1 in FIG. 5A) and non-activation packets (AV=0). When an activation packet is transmitted on the control/address bus by the memory controller, eight memory devices respond, or are activated. Using the above example, the eight memory devices activated in chip-kill mode have device IDs whose two most significant bits match the two most significant bits, bit 1 and bit 2, of the (first) device ID field contained in the exemplary ROW packet structure shown in FIG. 5A.

Thus, in chip-kill mode, the three least significant bits of the activation code, bits 3–5 in FIG. 5A, are not needed for memory device identification. Accordingly, these bits may be used for other control purposes, such as to identify one or more of sub-pages in the activated memory devices. Sub-page sensing is a particularly effective power saving mechanism in the context of a memory system capable of alternatively operating in non-chip-kill and chip-kill modes.

During a Read operation in non-chip-kill mode, when a memory device performs a sense operation as the result of a ROW packet, it moves a quantity of data, typically 1 KByte of data, into the sense amplifiers. A subsequent COL packet uniquely identifies a 16 byte quantity of the data stored in the sense amplifiers, and transfers this quantity of data from the sense amplifiers onto the data pins of the memory device connected to the channel. If additional data from the same "sensed" row is desired, then one or more additional COL packets are sent to select the desired data. By sending additional Read Col packets following a single sense operation (a ROW packet), the power required to perform the sense operation is efficiently amortized over multiple data transfers.

However, many times only a small amount of data is required, like 16 or 32 bytes. Thereafter, the memory device bank is precharged (i.e., closed). Much of the power required to sense an entire row of data is effectively wasted in these events. This type of problem becomes particularly pronounced during chip-kill operation of the memory system.

In our continuing example of chip-kill operation, eight memory devices respond to each ROW and COL packet. Without sub-page sensing, each one of the eight memory devices will move 1 KByte of data into the sense amplifiers in response to a ROW packet. However, a subsequent Read COL packet will transfer only 2 bytes of data from each of the memory devices onto the channel. In the event that only 16 bytes of data is transferred from memory out of the 8 KBytes of data transferred into the sense amplifier, an immense amount of power is effectively wasted.

In order to avoid this great waste of power, the used bits of the first device ID in the ROW packet may be used to uniquely identify a relatively smaller portion of the 8 KBytes which would other wise to transferred to the sense amplifiers. Using the above example of three (3) available ROW packet ID bits, down to ⅛th of the otherwise sensed data may be specified from each memory device. For example, 128 bytes could be specified from each device, such that the eight memory devices would transfer a total of 1 KByte of data to the sense amplifiers. A subsequent COL packet would then identify a 16 byte quantity of data out of the 1 KBYTE.

One consideration or design constraint which must be considered in the foregoing sub-page sensing approach relates to the relationship between the sensed data and the subsequent COL packet. Normally, a Read COL packet identifies a 16 byte quantity of data from the 8 KBytes of data present in the sense amplifiers. Since only ⅛th of this data is valid when the sub-page sensing approach is used, the memory controller must ensure that the ROW packet causing the sense operation, or some other memory device command, actually moves the correct 1 KBYTE of data into the sense amplifiers such that the subsequent COL packet will place valid data onto the channel.

Naturally, the foregoing numbers will change with the actual number of available ROW packet ID bits. For example, if only 1 used bit is available for sub-page sensing, ½ of the data in a row may be specified.

Alternatively, the three least significant bits of the ROW packet ID field can be used to provide some form of error checking for other control information in the ROW packet. For example, one of the three least significant bits can be used for simple parity checking of the command packet data. Additional hardware can be added to each memory device to check the parity of the command packet, along with a mechanism for having the memory device signal a parity error back to the memory controller.

These three least significant bits of the ROW packet activation command might also be used to expand memory device addressing options when the memory system is operating in chip-kill mode. In one example, these extra bits are used to uniquely identify additional groups of memory devices.

For example, in the examples described herein a group of eight memory devices typically responds to read/write command in chip-kill mode. Given the exemplary parameters described, up to four unique groups of eight memory devices may be defined and identified. However, by using the three least significant bits of the ROW packet activation command, a memory system designer may identify up to an additional eight (8) groups of memory devices. Such a capability would greatly expand the number of addressable memory devices on the channel and increase channel capacity accordingly.

In order to implement the capability of identifying additional groups of memory devices using the extra bits in the ROW packet command during chip-kill operation, several memory system parameters should be considered. For example, the memory device identification register, i.e., the register holding the unique memory device ID, would be modified to include additional ID bits. Further, COL packets would be modified to include more device ID bits as well. Depending on the nature and structure of the COL packets, such additional ID bits may be obtained by merely redefining the bits of the COL packet when the memory system is operating in chip-kill mode. One or more "reserve" bits provided in existing COL packets structures might be used for this purpose. Alternatively, COL packet bits typically used as a mask might also be used. Since mask operations might be disallowed in chip-kill mode anyway, such bits could readily be used.

Naturally, the focus here is not on the arbitrary definition of memory device groups, or memory device sub-pages. One may define responding memory devices having any reasonable partition of sub-pages, or define memory device groups having any reasonable number of memory devices. Of importance, however, is the concept that command packet bits having a first definition when the memory system is operating in non-chip-kill mode, such as a specific memory device identification, may have a second, different definition when the memory system is operating in chip-kill mode. Such operating mode specific bit definition allows the memory designer to implement an array of features, such as sub-page referencing, command packet verification, and additional memory device group identification in chip-kill mode. Such additional features are thus implemented with minimal change to the non-chip-kill memory system architecture, control parameters, and data structures.

In chip-kill mode, when a non-activation packet is transmitted over the channel by the memory controller, such as a Precharge command, eight memory devices respond to the command. Again, in the continuing example, the eight responding memory devices have device IDs in which two selected bits correspond with two bits in the device ID field of the ROW packet.

Thus, in chip-kill mode, eight memory devices respond to a Read or Write command packet placed on the control/address bus by the memory controller. In the cycle multiplexing example noted above, each of the eight activated memory devices must determine a half clock cycle during the four clock cycle time period in which to transmit their portion of the 16 byte data packet. That is, during a Read operation, each activated memory device must determine one half clock cycle in which to return data to the memory controller via the data bus. Similarly, during a Write operation, each memory device must determine what portion of the transmitted data packet to accept from the data bus. The Write operation based determination, like the Read operation based determination, is a timing issue.

In chip-kill mode, as with the ROW Packet, the three least significant bits of the (second) device ID field of the COL Packet are not used for device identification. Thus, they can be used to determine which two bytes of data a memory device returns during a Read operation, or which two bytes of data a memory device accepts during a Write operation. In other words, the three least significant bits of the COL Packet are used to determine a transmission cycle map. With the transmission cycle map and some simple logic hardware, each activated memory device will read/write data during a selected half cycle during the four clock cycle period of time in which a data packet is transmitted.

A specific example of a transmission cycle map is shown in FIG. 10. The upper horizontal table in FIG. 10 contains the three least significant bits, (DI[0], DI[1]) and DI [2])) of each memory device's IDs (Memory Device ID Bits). The lateral table contains the three least significant bits, (DC[0], DC[1], and DC[2]) from the device ID field of a COL packet. The logical combination of the bits represented in these tables results in the center table which identifies a half clock cycle for each memory device to read/write data from the data bus. As mentioned above, the memory device IDs are set during initialization of the memory system.

Thus, because the eight memory devices in the present example respond as a group to the two most significant bits in the COL packet device ID field, and the three least significant bits of this field are available for other purposes, the memory controller can determine, based on data addressing instructions received from a requestor, the contents of these three least significant bits in each COL packet. With this ability, the memory controller can determine transmission cycle timing for the memory device responding to each Read and Write operation in chip-kill mode.

This COL packet determined mapping feature allows each memory device to read/write during any half clock cycle of the 4 clock cycle data packet transmission period. If the Column packet ID were not used, then each memory device would only be able to read/write during a single half clock cycle independent of the address being accessed. In effect, this would mean that for all addresses being accessed, each memory device would only be able to read/write two bytes out of the sixteen bytes available, thus wasting ⅞ths of the available memory. However, in some memory system designs the additional hardware required to perform transmission cycle mapping and subsequent decoding may be unwanted. For such designs, the "waste" of memory space within the memory devices during chip-kill mode might be an acceptable tradeoff. In these systems, the transmission cycle during which each memory device accesses the data bus would be determined by memory device definition during system initialization.

Figure 11:
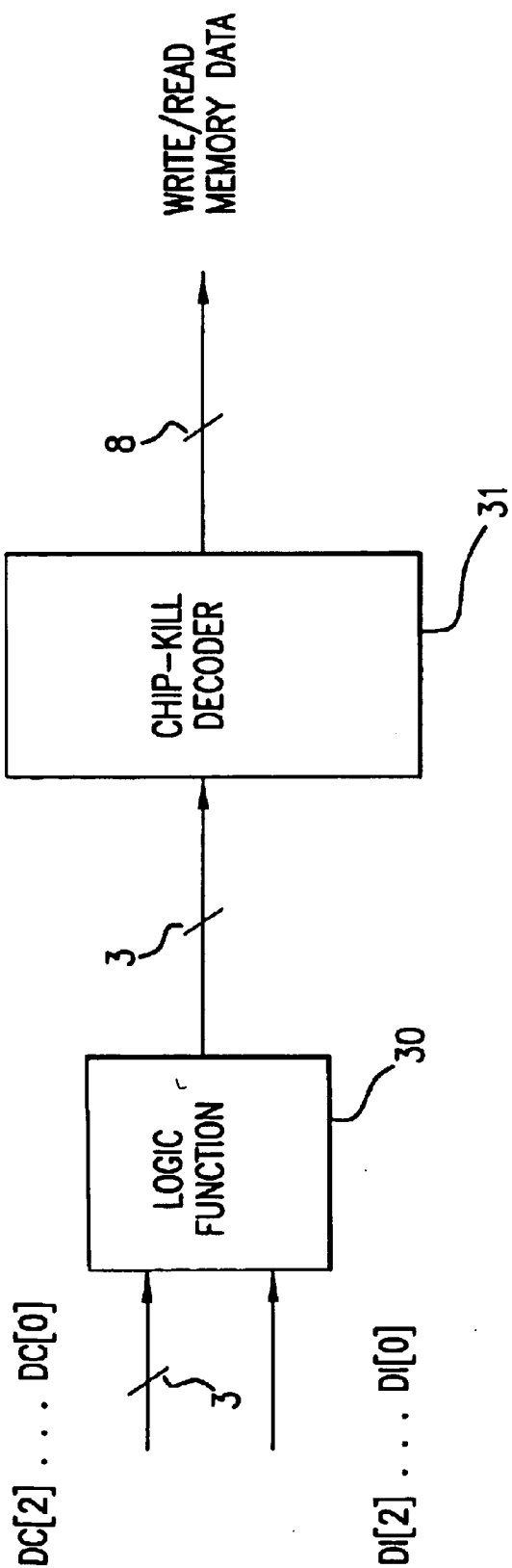
FIG. 11 is a logic diagram illustrating exemplary transmission cycle mapping hardware.

There are many ways to accomplish transmission cycle mapping in a memory system according to the present invention. However, use of the otherwise unused least significant bits of the COL packet device ID field is presently preferred. An example of a chip kill decoder hardware adapted to use the bits represented in the tables of FIG. 10 is shown in FIG. 11. Bits DC[2], DC[1], DC[0] and DI[2], DI[1], DI[0] are combined by a logic function block 30 to form a 3-bit decode signal for an 8-bit decoder 31. Logic function 30 may be any collection of digital logic suitable for the purpose. Addition, exclusive ORing, or exclusive NORing are ready examples of possible logic functions capable of combining the bits into a unique 3-bit decode signal. The table shown in FIG. 12 illustrates an exclusive NORing of the device ID bits DC[2]-DC[0] with the three least significant bits of the COL packet DI[2]-DI[0]. The 3-bit decode signal is applied to decoder 31 generating a 8-bit output. Each decoder output is connected to the input and output structures of the DRAM to enable data to be read from and written to the data bus during selected half clock cycles.

Figure 13:
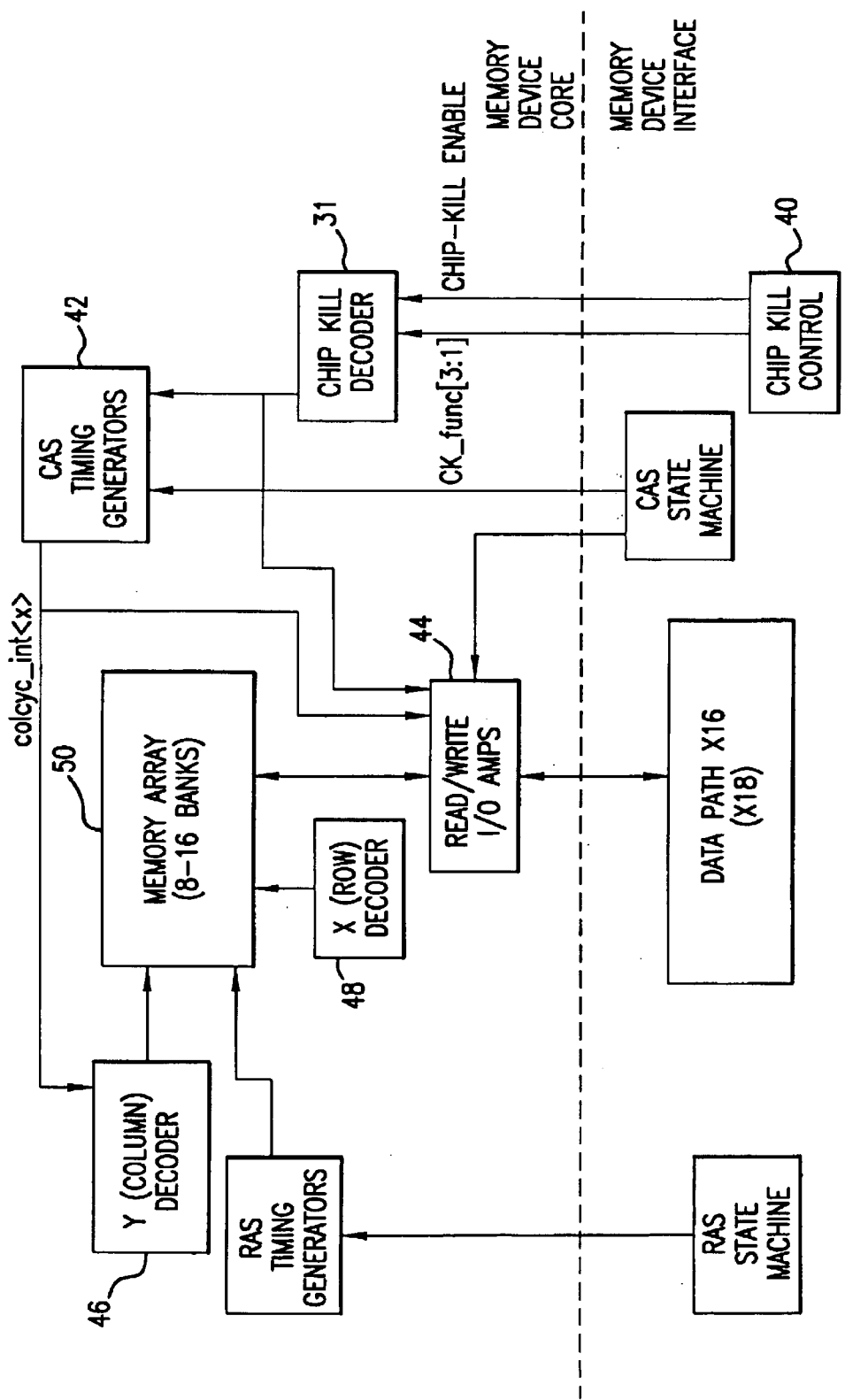
FIG. 13 schematically illustrates major elements of an exemplary memory device and memory device interface used in the present invention.

In some additional detail, FIG. 13 shows the incorporation of chip kill control circuit 40, including logic block 30, and chip kill decoder 31, described above, in an embodiment of a memory system according to the present invention. Some elements of FIG. 13 will not be described in detail, other than in their relationship to the chip-kill elements, for sake of clarity and brevity, but may be understood by review of the references noted above and incorporated by reference.

Chip kill control circuit 40 receives the three least significant bits of the COL packet ID (DC[2]- DI[0]) and the three least significant bits of the device ID field (DI[2]-DC[0]). As described above, these two inputs are logically combined to produce a three bit control signal, CK_func [3:1]. Along with the chip kill enable signal, the chip kill decoder control signal, CK_func[3:1], is sent to chip kill decoder 31.

In response to the chip kill decoder control signal and the chip kill enable signal, chip kill decoder 31 generates a control signal which is applied to the CAS timing generators 42 and Read/Write amplifiers 44. In turn, the CAS timing generators 42 output an I/O amplifier enable signal, colcyc_int<x>. As applied to Y (Column) decoder 46 and the Read/Write amplifiers 44, the I/O amplifier enable signal defines the chip kill transmission function identified by chip kill decoder 31.

The amplifier enable signal, colcyc_int<x>, is presently understood by those of ordinary skill in the art as one implementation, whereby the core of a memory device, i.e., the part actually storing data, is effectively connected to the memory device I/O drivers, such that data may be read from and written to the data channel. (See, FIG. 4). However, the present invention takes advantage of the existing amplifier enable signal, colcyc_int<x>, to effect the controlled output timing required to implement any one of the cycle multiplexing, bit multiplexing, and time/space multiplexing discussed above.

The amplifier enable signal, colcyc_int<x>, may be implemented in multiple wires. Together FIGS. 14, 15 and 16 illustrate the use of the amplifier enable signal with the Column decoder and I/O amplifier present in the assignee's memory system to accomplish data transmission to/from the memory device core according to the present invention.

Figure 14:
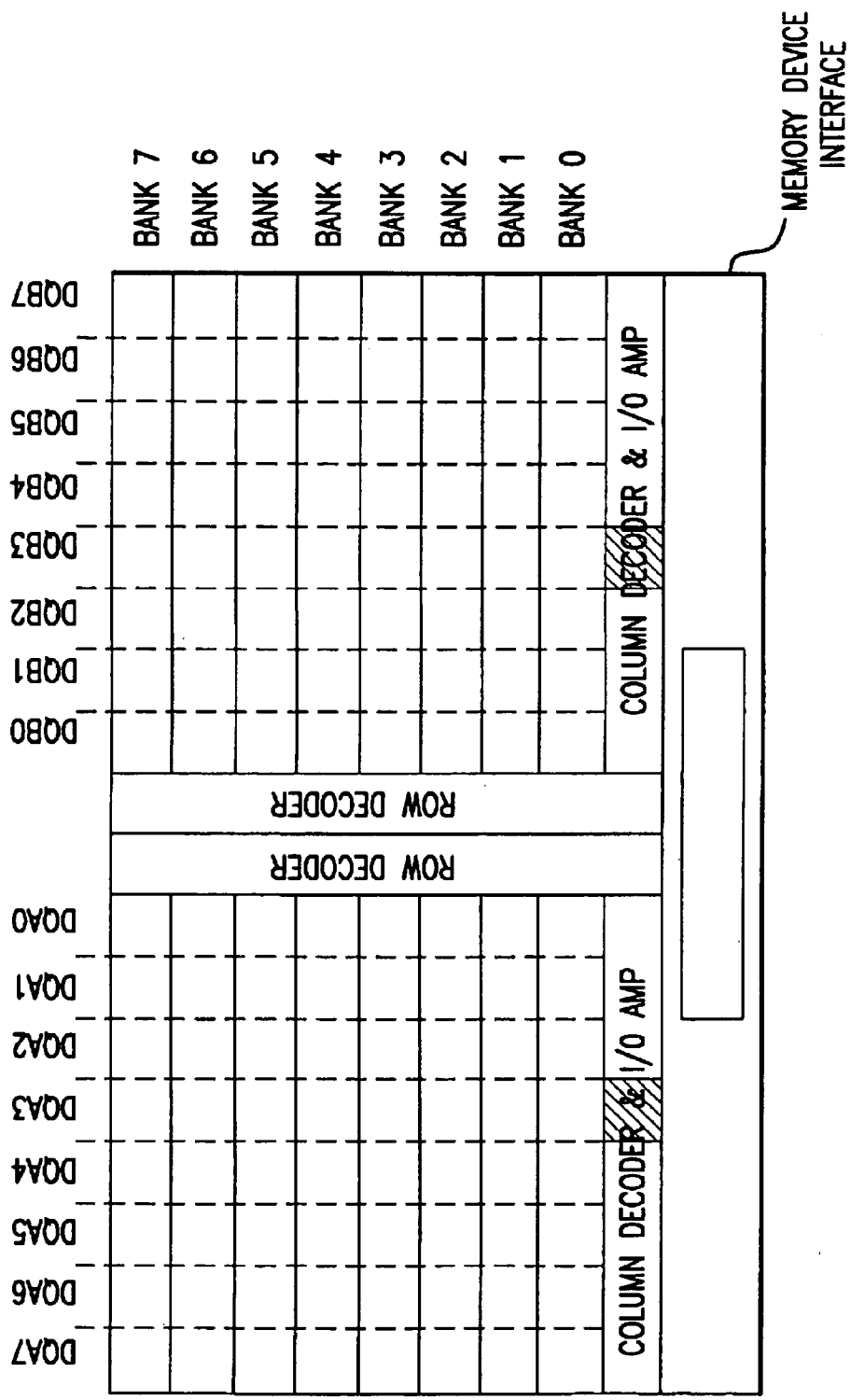
FIG. 14 is a layout diagram illustrating the relationship between several major memory device elements, including the I/O amplifiers shown in FIG. 13.

FIG. 14 illustrates a typical organization for the hierarchical I/O of a memory device. The organization shows the functional combination of Y (Column) decoder 46 with Read/Write I/O amplifiers 44, X (ROW) decoder 48, and Memory Array 50, together with the memory device interface, including a 16 bit data path (DQA7–DQA0 and DQB7–DQB0), although a 18-bit data path might also be used. Two examples of the cross-hatched portion of the Y (Column) decoder 46 and Read/Write I/O amplifiers 44 are shown in additional detail in FIGS. 15 and 16.

Figure 15:
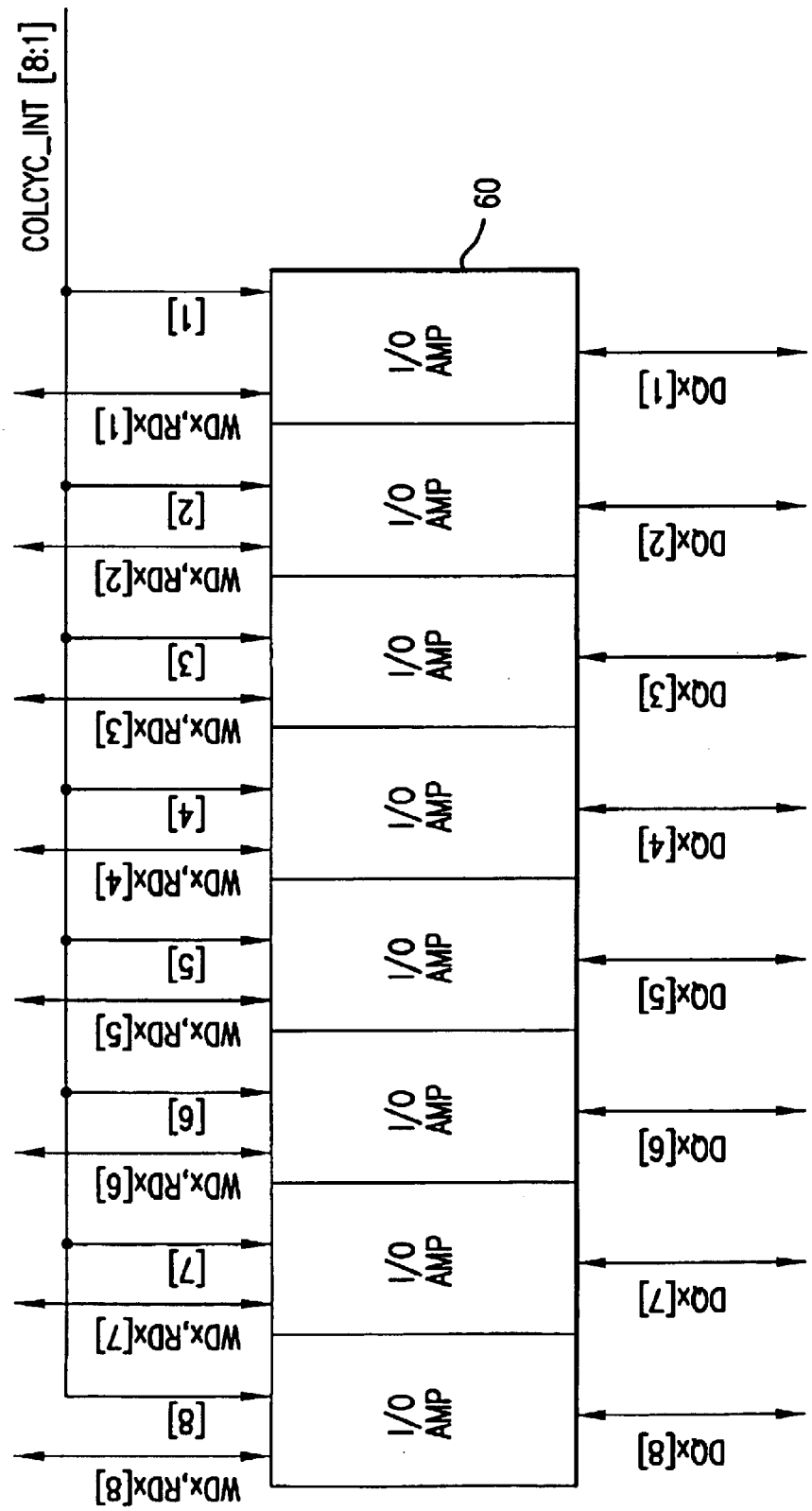
FIGS. 15 and 16 schematically illustrates the control of the I/O amplifiers of FIGS. 13 and 14 in some additional detail.
Figure 16:
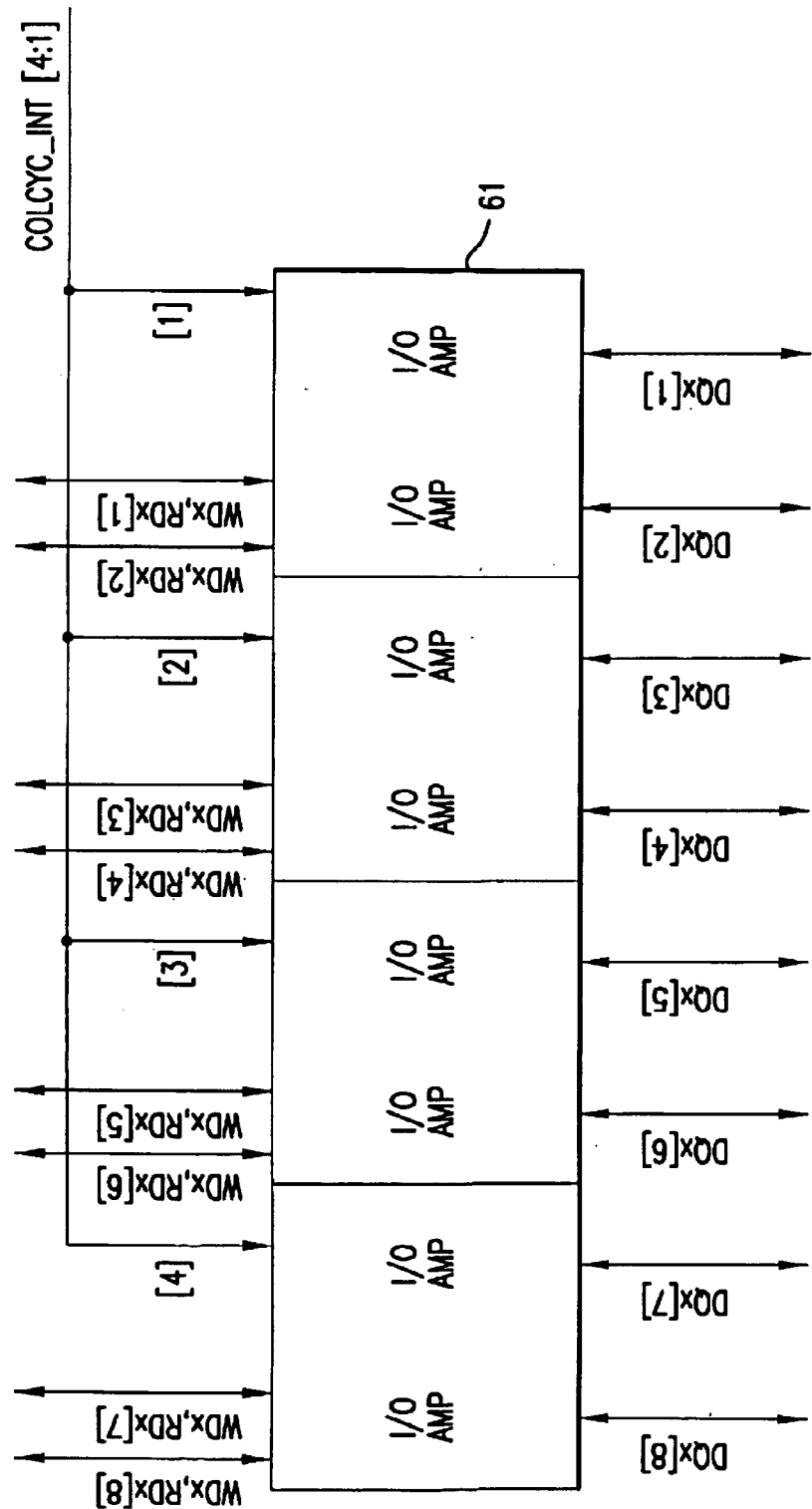

FIG. 15 shows an exemplary portion of the Y (Column) decoder 46 and Read/Write I/O amplifiers 44 as controlled by I/O amplifier enable signal, colcyc_int<x>, here a eight wire connection denoted colcyc_int[8:1]. Each Read/Write I/O amplifier 60 connects a data line DQ[x][i], where i ranges from 1 to 8, or from 1 to 9, with a corresponding read/write line in the memory core, WDx,RDx[i]. Further, the operation of each Read/Write I/O amplifier 60 is controller by the I/O amplifier enable signal, colcyc_int[8:1]. FIG. 16 shows a very similar example in which each wire in a 4 wire implementation of the I/O amplifier enable signal, colcyc_int[4:1] is applied to a dual Read/Write I/O amplifier group 61.

From the FIGS., 14, 15 and 16 one can see various implementations of the present invention. Again, our running example of a memory device providing 2 bytes of a 16-bytes data packet during a given half clock cycle of the four clock cycle data transfer period is assumed. One simple way to accomplish this second data block transfer, is to place only 2 bytes of data on the channel, but to have the memory system continue to "grab," as in non-chip kill mode, the full 16 bytes from the memory device. Selection of the desired 2 bytes of data might then be accomplished by disabling the output drivers for 14 of the 16 data bytes. For the disabled output drivers, the memory system is, in effect, unable to drive data onto the bus.

This first implementation works well and accomplishes the transfer of data as required by the present invention, but unnecessarily consumes power.

In a second implementation, only the small, cross-hatched portions of the Y (Column) decoder and Read/Write I/O amplifiers in FIG. 15 need be activated to transfer the 2 bytes of data. By limiting data access to such a portion, CAS power may be conserved by only accessing ⅛th of the memory device core, i.e., a ⅞th reduction in the CAS power required to access the memory core.

A similar reduction in RAS power may be accomplished using the sub-page activation discussed above. That is, instead of turning on all of the sub-word lines, only a fraction of the word lines (for example ⅛th) are activated. This effectively reduces page size and lowers RAS power accordingly.

An alternative to the transmission table approach described above will be discussed with reference to FIG. 17. This alternative will be explained in the context of the cycle multiplexing approach, but one of ordinary skill in the art will readily understand its application to the bit multiplexing approach as well.

In the exemplary transmission table method described above, each memory device uses a logical combination of its own unique device ID and selected bits form the COL packet command to determine which half-clock cycle that it will drive data onto the data bus during a Read operation, or take data from the data bus during a Write operation. In this way, a different memory device is selected to read/write data every half-clock cycle.

There are other ways to accomplish the result of having multiple memory devices contribute a portion of the data packet during a single data transfer cycle. For example, again using the example above, each one of the eight memory devices might be instructed to identify data during the same half-clock cycle, but thereafter drive their respective data into the data bus during a different half-clock cycle. A single COL packet might instruct the eight memory devices to retrieve data associated with half-clock cycle 0. However, all eight memory devices cannot transmit data during this half clock cycle. Instead, an additional step is required before data can be put on the data bus. The data from each memory device must be delayed by a different amount of time for each one of memory devices in order to sequence the transmission of the respective smaller data blocks during the data packet transfer cycle (first period of time). The delay time may be determined according to each memory devices unique ID, or by a sequence register established during memory system initialization.

Figure 17:
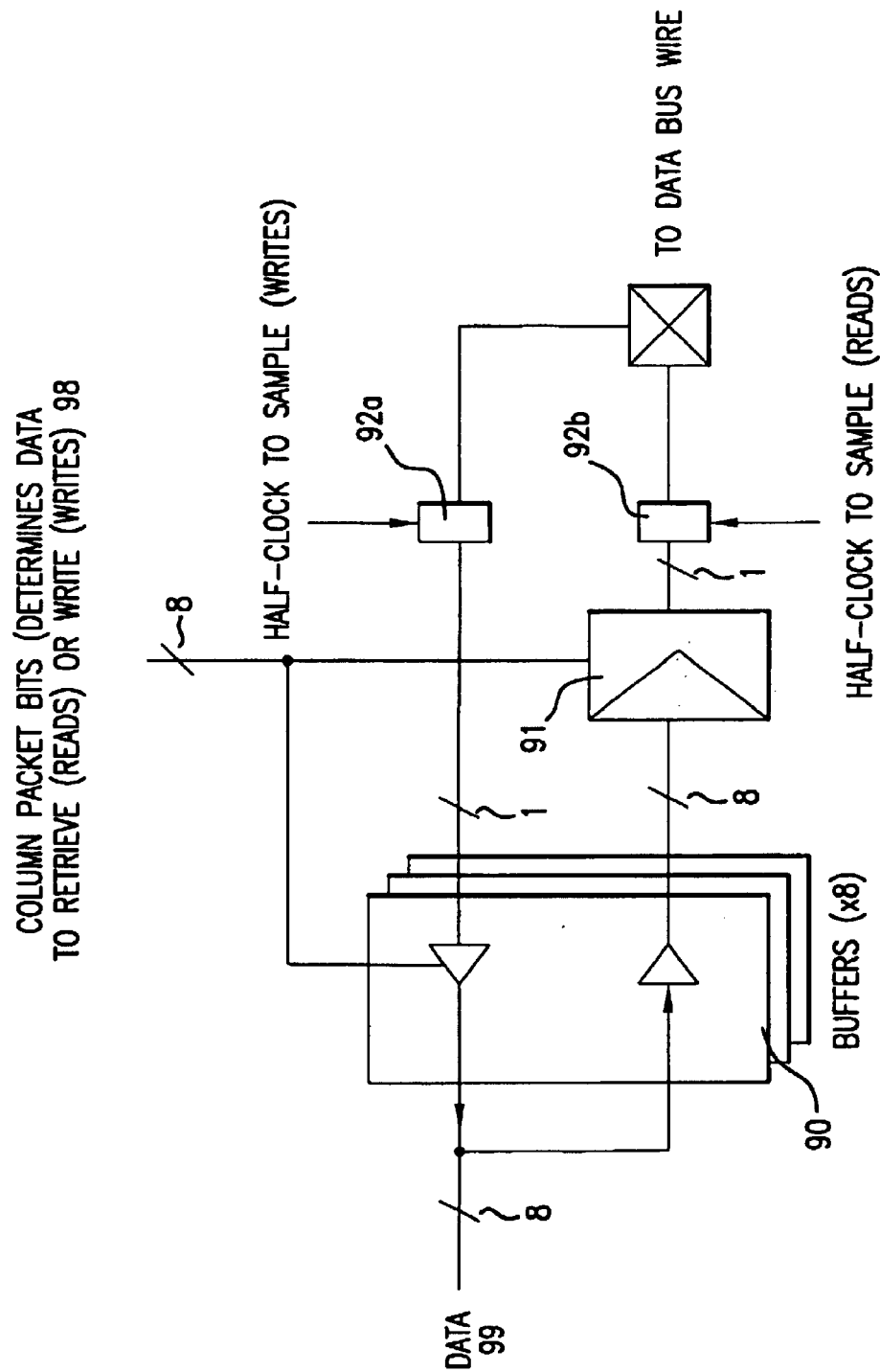
FIG. 17 is a diagram illustrating a circuit capable of implementing a delay technique to data bus multiplexing.

The circuit shown in FIG. 17 may be used to implement this data delay approach to multiplexing. Data 99 represents an 8-bit stream of data associated with each data bus wire in non-chip-kill mode over a data packet transfer cycle, i.e., 8 half-clock cycles. In chip-kill mode, and assuming cycle multiplexing, a single half-clock cycle's worth of data (1 bit) must be grabbed from this stream. During Read operations, the 8 bits are transmitted through a buffer (one of buffers 90 and buffer 91) and are multiplexed using the COL packet bits 98 to select only the data associated with a single half-clock cycle. This can be done using a transmission table, like the one shown in FIG. 10. The resulting one bit is then passed to another buffer 92b that indicates which half-clock cycle to drive the data onto the associated wire of the data bus. Each of the eight buffers in the present example must drive their bit at a different half-clock cycle, so each buffer must delay transmission by a different amount of time. The delay times may be established as explained above.

During Write operations the process is essentially reversed. The data associated with the half clock cycle that a memory device is instructed to sample each data wire 92a is delayed and then passed through the buffers to the memory core. Each memory device responding to the Write column packet samples at a different half-clock cycle. For each wire on the data bus, the data is delayed so that each memory device writes its data into the same fraction of the 16 byte data block in the memory core.

Figure 18:
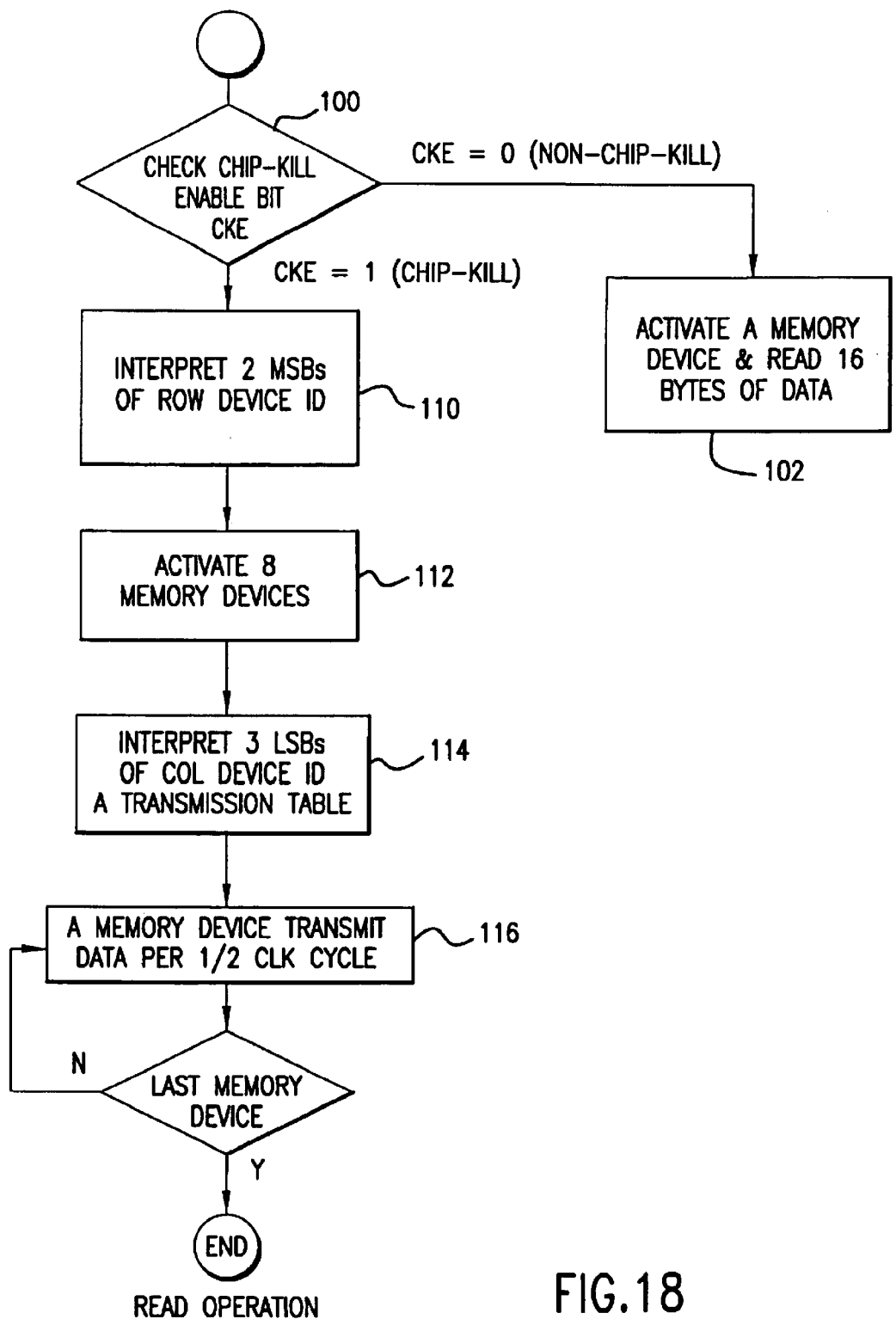
FIG. 18 is a flowchart illustrating an exemplary data transfer operation within the context of the present invention.

With the forgoing in mind, an exemplary Read operation will be described with reference to FIG. 18. First, the chip-kill enable bit is checked to determine whether the memory system is operating in chip kill mode (100). If not, the memory system operates in non-chip-kill mode. In this mode the memory controller transmits the non-chip-kill ROW and COL commands required to activate a memory device and read 16 bytes of data from the activated memory device over four clock cycles (102).

If, however, the chip-kill enable bit is set, the memory system operates in chip-kill mode. When an activate ROW packet is transmitted by the memory controller in chip-kill mode, the memory controller transmits a ROW command in which only two bits are interpreted as device activation IDs (110). In response to these two bits, a plurality (8) of memory devices activates (112). (Optionally, at this point the memory controller may also provide three bits in the place of the three least significant bits, otherwise unused, of the ROW device activation ID, and use these three bits to perform the sub-page activation discussed above within the activated memory devices).

Further, the memory controller provides the three least significant bits of the transmitted COL command, bits 3–5 in FIG. 5B, to the chip kill control circuit (114). These three bits, in conjunction with the three least significant bits of the device IDs, uniquely identify a Read transmission table for the activated memory devices. In sequence, each memory device returns two bytes of data per half clock cycle according to the Read transmission table (116).

A memory system according to the present invention might use the existing Write Mask hardware during the foregoing Read operation to "mask out" 14 of the 16 data bytes on the bus each half clock cycle. In more detail, the "Read mask" instructs a single memory device to drive data onto the bus during any half clock cycle. The other, non-selected memory devices are instructed to merely write all "0's" to the bus during the half clock cycle. The wired "OR" nature of the data bus thus allows multiple memory devices to combine their outputs during a single data packet transmission period to yield the data packet.

A Write operation proceeds similarly, albeit with data being written to the memory device(s) rather being read from them. That is, upon determining operation in chip-kill mode, the memory controller generates a unique Write Mask based on the three least significant bits of the COL Write command. In non-chip-kill mode, the memory controller generates the Write mask. However, in chip-kill mode, the Write mask can be internally generated according to these three bits, i.e., according to a Read/Write transmission table defined by these three bits in conjunction with a portion of the device IDs.

In the example consistently used throughout, the same number of devices respond to ROW packets as respond to COL packets. However, it is possible to have a different number of devices respond to ROW packets that COL packets. This ability can be very useful for memory systems which map consecutive column addresses to different memory device groups. For example, when consecutive Read operations to adjacent column addresses map to different memory device groups, each group will require an Activate operation before the Read operation is performed. In systems in which the number of Column operations per Active operation is fixed and larger than 1, ROW command bandwidth can be reduced by having multiple memory device groups respond to each Activate (ROW) packet. For example, if it is known that two Column operations are performed for each Activate (ROW) operation, and if it is the case that these two Column operations span two memory device groups, then Row command bandwidth can be saved by having both memory device groups respond to the same Activate packet. This saves Row command bandwidth so that it can be used for other operations.

Many of the foregoing examples have been made with reference to the cycle multiplexing approach of the present invention. While offering many benefits, the cycle multiplexing approach is, however, not suitable for all memory system architectures. In fact, a number of serious considerations must be addressed before implementing cycle multiplexing.

Figure 19:
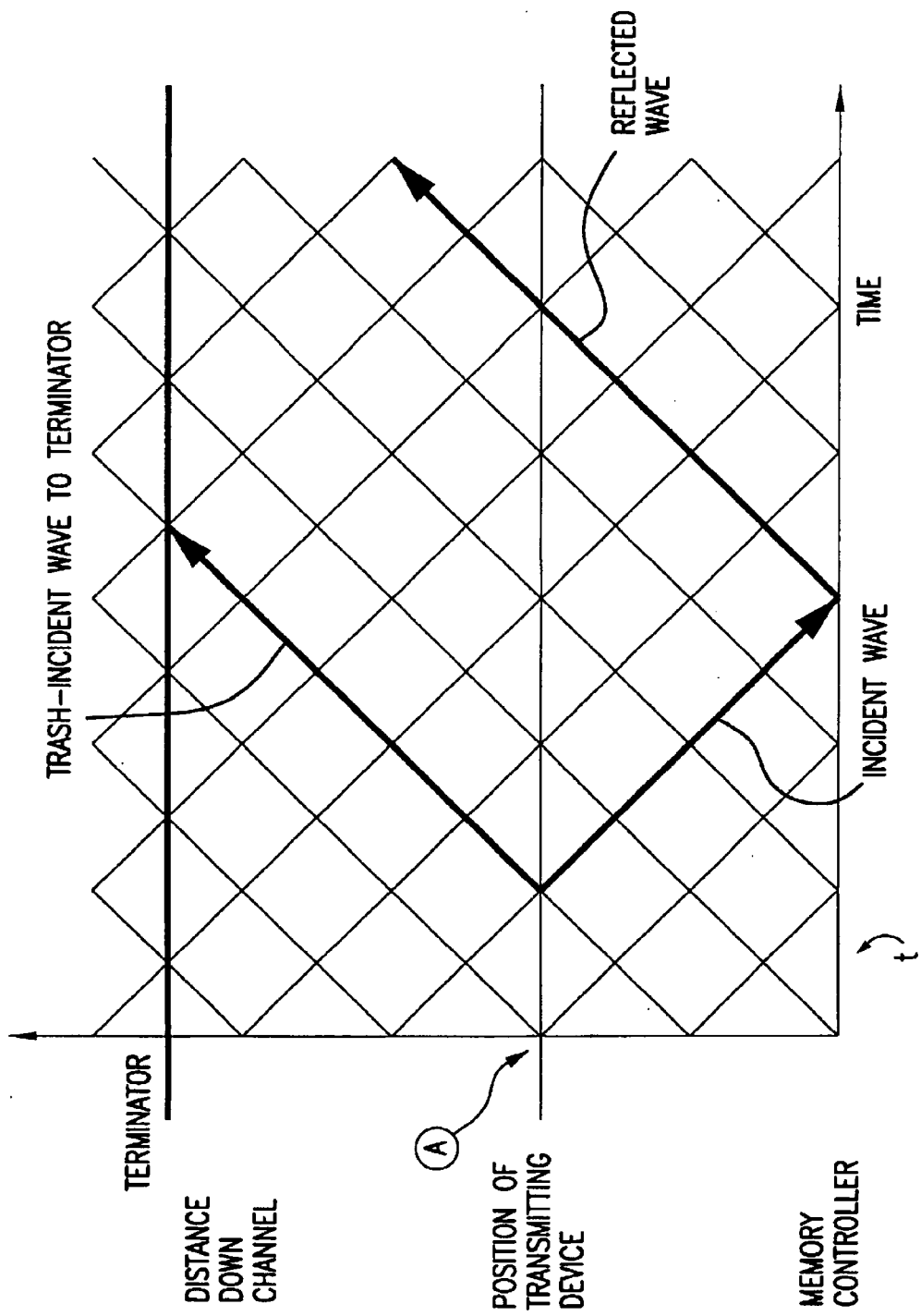
FIG. 19 is a timing diagram conceptually illustrating the transmission of signals on the channel of the present invention, under a first set of assumed conditions.

For example, in a memory system such as the one described above with reference to FIGS. 3 and 4, channel engineering constraints necessarily limit the implementation of the cycle multiplexing approach. FIG. 19 illustrates one basic channel environment which suffers from such limitation.

In FIG. 19, time is shown by the horizontal axis, and memory device position along a channel between the memory controller and the terminator is shown by the vertical axis, as a function of time. In the illustrated example, a transmitting memory device (during a write transaction, for example) is located at position "A" on the channel and transmits at time "t." As can be seen from FIG. 19, the transmission of data from the memory device onto the channel at time t results in an incident wave directed to the memory controller, and in a corresponding "trash" wave directed to the terminator. When the incident wave reaches the memory controller, a reflected wave is produced back down the channel. Nominally, the incident wave, trash wave and reflected wave have equal magnitudes, given the impedance matched channel. Given certain memory device spacings along the channel and certain transmission timing possibilities, the trash wave and/or the reflected wave from one or more memory device(s) actually become noise signals to the incident wave of another memory device transmitting data onto the channel during a subsequent time period, i.e., cycle. One such outcome is illustrated in FIG. 20.

Figure 20:
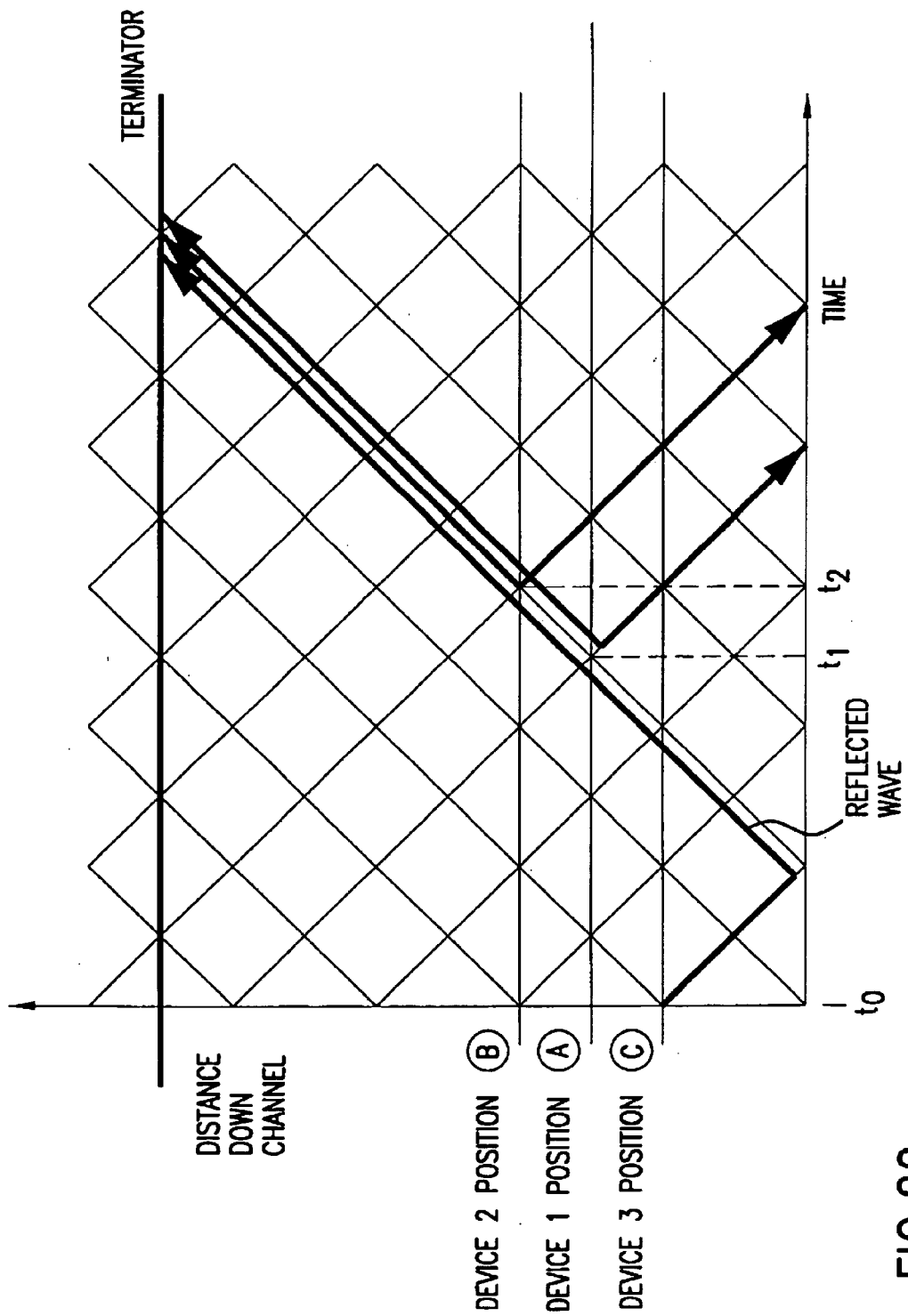
FIG. 20 is another timing diagram conceptually illustrating the transmission of signals on the channel of the present invention, under a second set of assumed conditions.

In FIG. 20, it is assumed that a first memory device is located at position "A" transmits data onto the channel at time $t_1$, and that a second memory device is located at position "B" transmits data onto the channel at time $t_2$. Further, it is assumed that another wave from a prior transmission is present on the channel, e.g., a third memory device at position "C" transmitted data onto the channel at time $t_0$. With these assumptions, one can see that at time $t_2$ when the second memory device transmits data onto the channel both the trash wave from the first memory device transmission at time t, and the reflected wave are on the channel.

Assuming a memory system terminal voltage (Vterm) of 1.8 Volts and a half wave voltage of 0.4 Volts, the noise effect of the trash wave and the reflected wave in the foregoing example can be readily seen by the equation (1):

$$V_{term} - V_{reflect} - V_{trash} - V_{pkt} = V_{output\ gate} \qquad (1)$$

Since $V_{reflect}$, $V_{trash}$, and $V_{pkt}$ are all nominally half wave signals on the channel, the voltage at the output gate for the second memory device transmitting at time $t_2$ is about 0.6 Volts. Assuming the open NMOS gate structure described above for the output gate, and in the context of a read operation, the second memory device just barely succeeds in transmitting data onto the channel under these conditions. Clearly, any significant additional noise source on the channel further lowering the effective output gate voltage will preclude the second memory device from transmitting data onto the channel. The foregoing example, the so-called 3/2 wave condition, represents a critical threshold for successful operation of the exemplary memory system described above.

Unfortunately, certain memory device spacings along the channel taken with certain memory device transmission patterns will result in a 4/2 wave condition on the channel, or worse. Thus, memory device spacing along the channel, channel length, memory device transmission timing (i.e., the period of time during which each memory device transmits data to the memory controller), memory system transmission voltages, and the sequence by which specific memory devices transmit data onto the channel must all be taken into account when designing a memory system using the cycle multiplexing approach.

When channel timing constraints are encountered during the design of memory system using the cycle multiplexing approach a number of considerations are suggested. First, the order in which the memory devices transmit data may be permutated to preclude unacceptable interference levels. For example, the transmission scheme shown in FIG. 7 may, under certain conditions, fail to function properly when memory device 0 is closest to the memory controller. Whereas, sequencing the transmission of memory devices from "back-to-front, " where "back" is defined in relation to the memory device closest to the terminator, results in acceptable system performance. Maintaining an acceptable ordering for memory device transmissions along the channel may well require that additional timing circuitry be incorporated into each memory device.

Other factors addressing the channel interference problem associated with cycle multiplexing include; raising the terminal voltage, limiting the physical length of each channel, and/or changing the output gate circuit configuration. Further, delay cycles may be introduced by the memory controller to avoid conditions likely to result in unacceptable channel interference.

The foregoing channel interference problems do not effect the bit multiplexing approach as seriously as the cycle multiplexing approach. That is, for channels of a given length, noise problems, such as those illustrated above, more readily appear in memory systems implementing a cycle multiplexing approach, as compared with memory systems implementing the bit multiplexing approach.

Accordingly, bit multiplexing may be more readily adopted in existing memory systems. As noted above, bit multiplexing is generally a response by a plurality of memory devices to a single memory controller command, or set of commands, in which each one of the plurality of memory devices receive/transmit some portion of a data block associated with the memory controller command(s). Each memory device provides its respective portion via one or more "dedicated" signal line(s) in a data bus. The one or more signal line(s) are dedicated to the memory device during the period of time required to transfer data to/from the memory controller. Thereafter, the signal line(s) are released for normal operation.

One of ordinary skill in the art will appreciate that the selection and definition of signal lines in relation to the responding plurality of the memory devices is a matter of design choice. Some memory devices may use more signal lines than other memory devices, according to the memory system designers requirements. For example, FIG. 21 illustrates one presently preferred embodiment in which a plurality of memory devices (DEVID 0— DEVID 8) respond during a four clock cycle time period to transmit data via a data bus comprising eighteen signal lines divided into two portions (DQA and DQB), each portion having nine signal lines (0–8).

Figure 21:
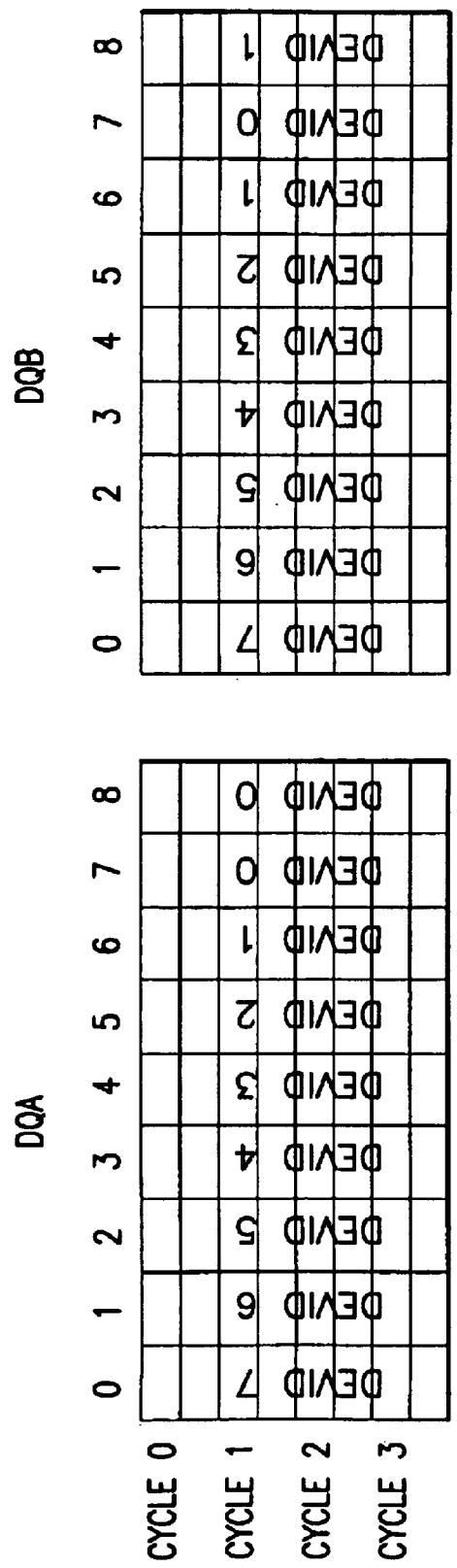
FIG. 21 illustrates the transmission arrangement of a plurality of memory devices performing another, exemplary form of bit multiplexing.

Of note in the example shown in FIG. 21, each memory device drives data (assuming a read command) onto at least two signal lines. However, to readily obtain 9 bit data bytes convenient to chip-kill syndrome generation memory devices DEVID 1 and DEVID 0 each drive three signals lines. If 8 bit data bytes where used in the example, each memory device would only drive one signal line per data bus portion.

The preference for a ninth syndrome bit in addition to the 8 bits forming a conventional byte creates some interesting addressing challenges for a memory system designer implementing a bit multiplexing approach. One possible solution is shown in FIG. 22.

Figure 22:
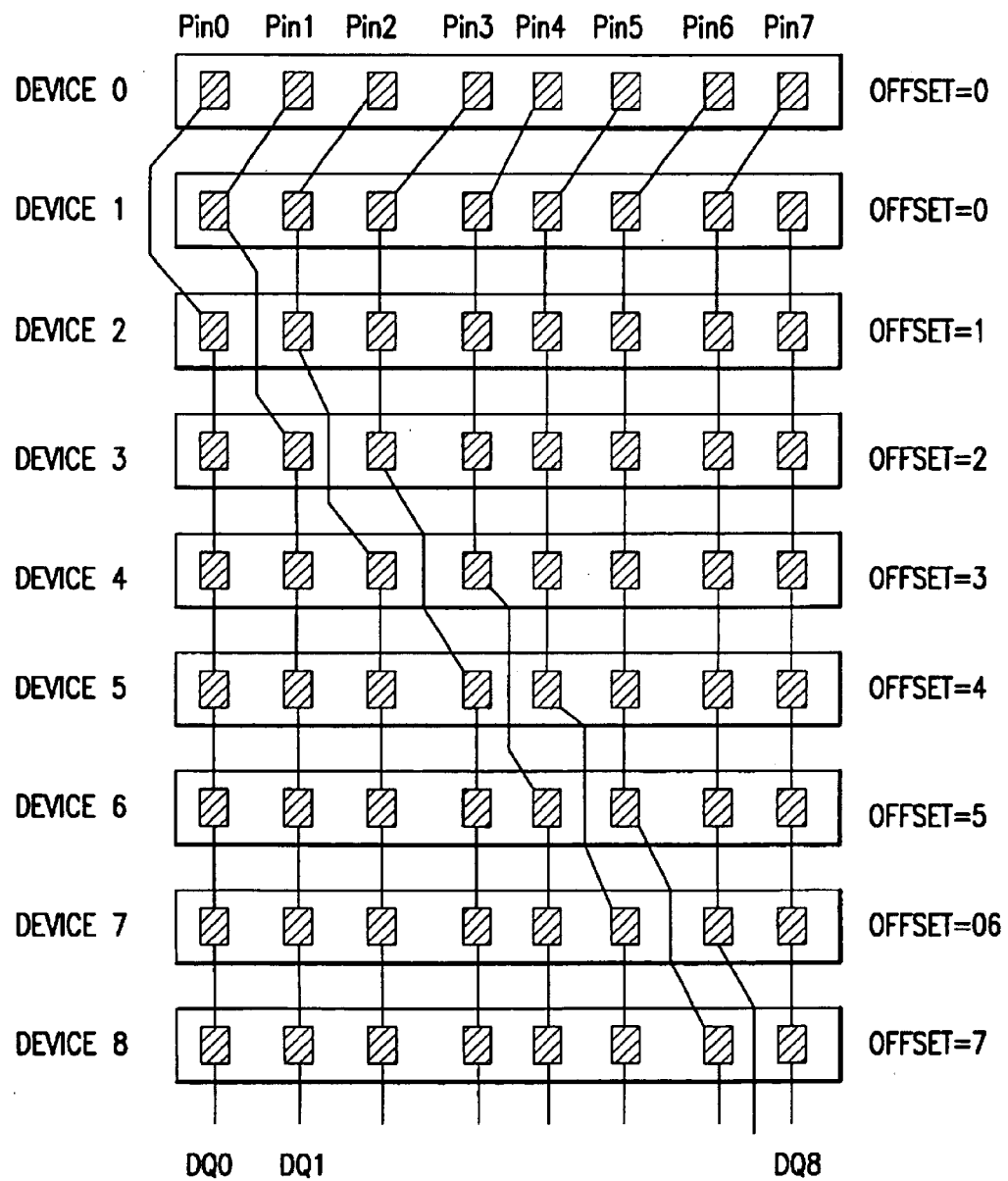
FIG. 22 illustrates one bit line swizzle approach to bit multiplexing.

The structure shown in FIG. 22 has been termed a "bit line swizzle" in which N bits lines traverse an array of N memory devices, each memory device providing M bits, where M is less than N. In the present example, an array of nine 8-bit memory devices are traversed by nine bit lines which "swizzle" through the array, i.e., do not linearly connect corresponding bit pins in adjacent memory devices. Using this structure, each memory device chooses a different bit pin based on, for example, the three least significant bits of the COL packet described above. Within the bit line swizzle approach, these three COL bits form an "address value," ranging from 0 to 7.

For any address value, taken in combination with programmable (0 to 7) offset value assigned to each memory device, the nine memory devices will respond as a group to generate a data packet. That is, the address value and the offset value are used to create a unique address modifier which allows each memory device to select a different data pin during a transmission/reception time period. Data pin selection is made according to equation below.

$$\text{Selected pin}=(\text{offset value}+\text{address value})\text{MOD }8 \qquad (2)$$

As can be seen from FIG. 22, each memory device drives only one data pin per respective address value, yet nine data pins will always be driven and 9 bit bytes accordingly generated. Obviously, the eight data pins per memory device are not strictly or linearly bussed. Assuming a memory module incorporating the N (nine) memory devices, each memory device having N–1 (eight) data pins, the module would include N (nine) bits lines (solder traces or other bit line implementation). However, each bit line would connect to only N–1 (eight) memory devices. The layout shown in FIG. 22 is just one possible implementation for the module bits lines.

The use of an offset value in the foregoing approach is also just one possibility. It is not necessary. For example, the wiring scheme between memory devices in the module may in and of itself be used to effect the desired result. While the specific example illustrated in FIG. 22 is presently preferred, the bit line swizzle approach is very general and may be implemented in numerous forms and structures.

Figure 23:
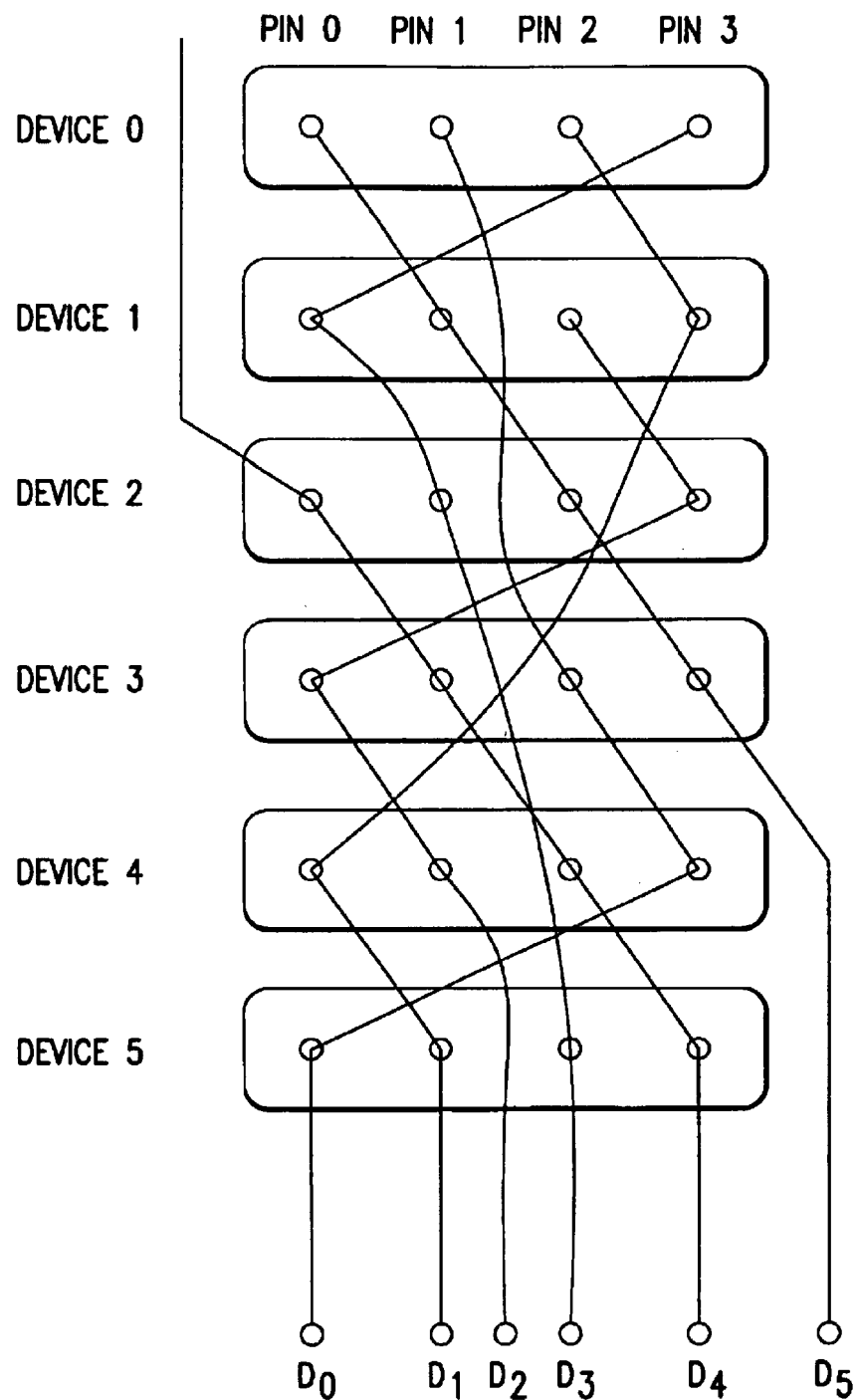
FIG. 23 illustrates another bit line swizzle approach to bit multiplexing.

FIG. 23 is another exemplary structure illustrating the bit line swizzle approach. In FIG. 23, six memory devices are arranged in a memory module, each memory device having four data pins. Six bit lines, or data wires, traverse the array of memory devices in a manner much more non-linear than that shown in FIG. 22. However, the system illustrated in FIG. 23 does not use an offset to effect addressing. Thus, by way of comparison between the two illustrated example, the it memory devices arranged in the memory module of FIG. 23 all have an offset of 0, but the wiring becomes more complicated. However, consistent with the bit line swizzle approach, the memory module of FIG. 23 connects N data wires through N memory devices having M data pins each, where N is greater than M.

What is claimed is:

1. A memory module comprising:
    an array of N memory devices, each memory device having M data pins, where N is greater than M, M is equal to or greater than three, and M and N are positive integers; and
    N bit lines traversing the array of N memory devices, such that each one of the N bit lines is connected to M of the N memory devices.

2. The memory module of claim 1, wherein each memory device in the plurality of memory devices further comprises a register holding an offset value.

3. The memory module of claim 2, wherein each memory device in the plurality of memory devices is addressable by an address value, such that a combination of the address value and the offset value within each memory device selects a data pin for the transmission or reception of data.

4. The memory module of claim 1, wherein each memory device in the plurality of memory devices is addressable by an address value, such that a combination of the address value and an offset value within each memory device selects a data pin for the transmission or reception of data.

5. A memory module comprising:
   an array of N memory devices, each memory device having M data pins, where N is greater than M, M is equal to or greater than four, and M and N are positive integers; and
   N bit lines traversing the array of N memory devices, such that each one of the N bit lines is connected to M of the N memory devices.

6. The memory module of claim 5, wherein each memory device in the plurality of memory devices further comprises a register holding an offset value.

7. The memory module of claim 6, wherein each memory device in the plurality of memory devices is addressable by an address value, such that a combination of the address value and the offset value within each memory device selects a data pin for the transmission or reception of data.

8. The memory module of claim 5, wherein each memory device in the plurality of memory devices is addressable by an address value, such that a combination of the address value and an offset value within each memory device selects a data pin for the transmission or reception of data.

9. A memory system, comprising:
   a memory controller;
   a memory module coupled to the memory controller and responsive to memory access commands from the memory controller, the memory module including an array of N memory devices, each memory device having M data pins, where N is greater than M, M is equal to or greater than four, and M and N are positive integers; and
   N bit lines traversing the array of N memory devices, such that each one of the N bit lines is connected to M of the N memory devices.

10. The memory system of claim 9, wherein each memory device in the plurality of memory devices further comprises a register holding an offset value.

11. The memory system of claim 10, wherein each memory device in the plurality of memory devices is addressable by an address value, such that a combination of the address value and the offset value within each memory device selects a data pin for the transmission or reception of data.

12. The memory system of claim 9, wherein each memory device in the plurality of memory devices is addressable by an address value, such that a combination of the address value and an offset value within each memory device selects a data pin for the transmission or reception of data.

* * * * *